US012751116B2

(12) United States Patent
Bae et al.

(10) Patent No.: US 12,751,116 B2
(45) Date of Patent: Sep. 29, 2026

(54) DISPLAY DEVICE HAVING ALIGNMENT ELECTRODES ELECTRICALLY SEPARATE FROM CONNECTION ELECTRODES

(71) Applicant: Samsung Display Co., LTD., Yongin-si (KR)

(72) Inventors: Sung Geun Bae, Yongin-si (KR); Da Sol Jeong, Yongin-si (KR); Jang Soon Park, Yongin-si (KR); Jeong Hyun Lee, Yongin-si (KR); Won Hyeong Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 592 days.

(21) Appl. No.: 17/575,110

(22) Filed: Jan. 13, 2022

(65) Prior Publication Data

US 2022/0310881 A1 Sep. 29, 2022

(30) Foreign Application Priority Data

Mar. 29, 2021 (KR) ........................ 10-2021-0040589

(51) Int. Cl.
*H10H 20/831* (2025.01)
*H10H 20/857* (2025.01)
*H10H 29/14* (2025.01)

(52) U.S. Cl.
CPC ...... *H10H 20/8316* (2025.01); *H10H 20/857* (2025.01); *H10H 29/142* (2025.01)

(58) Field of Classification Search
CPC ..... H01L 33/387; H01L 27/156; H01L 33/62; H01L 27/124; H01L 27/1248
See application file for complete search history.

(56) References Cited

U.S. PATENT DOCUMENTS

| | | | | |
|---|---|---|---|---|
| 10,943,947 | B2 | 3/2021 | Im et al. | |
| 11,594,171 | B2 | 2/2023 | Kang et al. | |
| 11,600,756 | B2 | 3/2023 | Kim et al. | |
| 12,166,017 | B2 | 12/2024 | Lim et al. | |
| 12,183,857 | B2 | 12/2024 | Kim et al. | |
| 2019/0326348 | A1* | 10/2019 | Im | H10H 29/142 |
| 2020/0005703 | A1 | 1/2020 | Kim et al. | |
| 2020/0066699 | A1* | 2/2020 | Kim | H10W 90/00 |

(Continued)

FOREIGN PATENT DOCUMENTS

| | | | |
|---|---|---|---|
| CN | 112420763 | A | 2/2021 |
| CN | 112424961 | A | 2/2021 |

(Continued)

OTHER PUBLICATIONS

Extended European search report for European Patent Application or Patent No. 22164791.0, dated Aug. 29, 2022.

*Primary Examiner* — Chad M Dicke
*Assistant Examiner* — Jeremy Daniel Watts
(74) *Attorney, Agent, or Firm* — Womble Bond Dickinson (US) LLP

(57) ABSTRACT

A display device includes a transistor disposed in a pixel, a connection electrode electrically connected to the transistor, first electrodes electrically separated from the connection electrode, light emitting elements disposed between the first electrodes, and second electrodes disposed on the first electrodes and the light emitting elements. The second electrodes electrically connect the connection electrode and the light emitting elements.

19 Claims, 13 Drawing Sheets

(56) References Cited

U.S. PATENT DOCUMENTS

| | | | | |
|---|---|---|---|---|
| 2020/0105849 | A1 | 4/2020 | Kim et al. | |
| 2020/0258938 | A1* | 8/2020 | Chai | H10D 1/692 |
| 2021/0272937 | A1 | 9/2021 | Lim et al. | |
| 2022/0050334 | A1* | 2/2022 | Tsao | G02F 1/13373 |
| 2022/0173160 | A1* | 6/2022 | Pak | H10H 29/142 |

FOREIGN PATENT DOCUMENTS

| | | | |
|---|---|---|---|
| CN | 112514085 | A | 3/2021 |
| KR | 10-2019-0075869 | | 7/2019 |
| KR | 10-2019-0121894 | | 10/2019 |
| KR | 10-2020-0026781 | | 3/2020 |
| KR | 10-2020-0032809 | A | 3/2020 |
| KR | 10-2021-0145030 | | 12/2021 |
| WO | 2020/013407 | | 1/2020 |

* cited by examiner

BNP: BNP1~BNP3
ALE: ALE1~ALE4
LD: LD1~LD4
ELT: ELT1~ELT5
CNT: CNT1,CNT2
CH: CH1,CH2
OPA: OPA1,OPA2
CNE: CNE1,CNE2

DISPLAY DEVICE HAVING ALIGNMENT ELECTRODES ELECTRICALLY SEPARATE FROM CONNECTION ELECTRODES

CROSS-REFERENCE TO RELATED APPLICATION(S)

This application claims priority to and benefits of Korean Patent Application No. 10-2021-0040589 under 35 U.S.C. § 119, filed on Mar. 29, 2021 in the Korean Intellectual Property Office, the entire contents of which are incorporated herein by reference.

BACKGROUND

1. Technical Field

The disclosure relates to a display device.

2. Description of the Related Art

As interest in display devices increases, research and development relating to display devices is continuously being conducted.

SUMMARY

An aspect of the disclosure is to provide a display device capable of improving reliability and a luminance characteristic of a display panel.

Aspects of the disclosure are not limited to the above-described aspect, and other technical aspects which are not described will be clearly understood by those skilled in the art from the following description.

A display device according to an embodiment may include a transistor disposed in a pixel, a connection electrode electrically connected to the transistor, first electrodes electrically separated from the connection electrode, light emitting elements disposed between the first electrodes, and second electrodes disposed on the first electrodes and the light emitting elements. The second electrodes may electrically connect the connection electrode and the light emitting elements.

The first electrodes may be electrically separated from the light emitting elements.

The connection electrode may be disposed between the transistor and the second electrodes in a cross sectional view.

The second electrodes may be electrically separated from the first electrodes, and at least one pair of the second electrodes and the first electrodes may overlap each other and may receive different signals.

The display device may further include an insulating layer disposed on the first electrodes, wherein at least one of the second electrodes may be electrically connected to the connection electrode through a contact hole passing through the insulating layer.

The at least one second electrode may be electrically connected to the transistor through the connection electrode.

The at least one second electrode may be in electrical contact with the connection electrode.

The connection electrode and the second electrode may be formed of a same material.

The connection electrode may not overlap the first electrodes.

The display device may further include an emission area, a first non-emission area surrounding the emission area, and a second non-emission area adjacent to the first non-emission area and spaced apart from the emission area.

The display device may further include a bank disposed in the first non-emission area.

The bank may include a first opening overlapping the emission area, and a second opening overlapping the second non-emission area.

The connection electrode may be disposed in at least one of the first non-emission area and the second non-emission area.

The connection electrode may at least partially overlap the bank.

The connection electrode may be electrically connected to the transistor through a first contact hole disposed in the first non-emission area.

The second electrode may be electrically connected to the connection electrode through a second contact hole disposed in the second non-emission area.

The second electrode may extend from the emission area to the second non-emission area through the first non-emission area.

The transistor may include at least one of a source electrode and a drain electrode, and the connection electrode may be electrically connected to the source electrode or the drain electrode.

The display device may further include a bridge electrode disposed on the source electrode or the drain electrode, wherein the connection electrode may be electrically connected to the source electrode or the drain electrode through the bridge electrode.

The display device may further include an insulating layer disposed on the bridge electrode, wherein the connection electrode may be in electrical contact with the bridge electrode through a contact hole passing through the insulating layer.

Details of other embodiments are included in the detailed description and drawings.

According to an embodiment of the disclosure, since alignment electrodes may be electrically separated from connection electrodes and/or pixel electrodes, even though a defect occurs, the alignment electrodes may be independently repaired to improve reliability of a display panel. Since the pixel electrodes may be connected (e.g., directly connected) to the connection electrodes and electrically connected to a pixel circuit through the connection electrodes, a luminance decrease due to an RC delay may be prevented.

An effect according to embodiments is not limited by the contents illustrated above, and additional effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
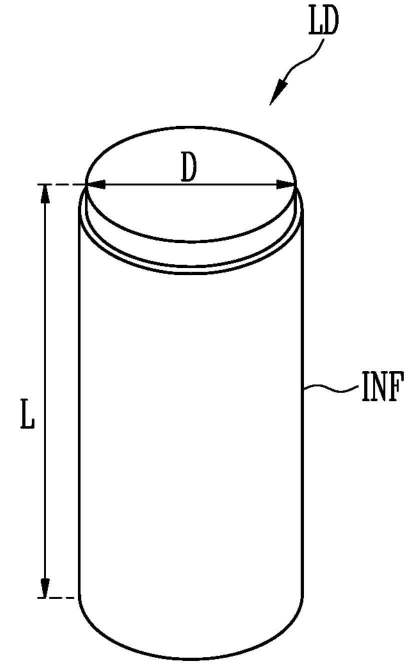
FIGS. 1 and 2 are schematic perspective and cross-sectional views illustrating a light emitting element according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various forms. The embodiments are provided so that the disclosure will be thorough and complete and those skilled in the art to which the disclosure pertains can fully understand the scope of the disclosure. The disclosure is only defined by the scope of the claims including equivalents thereof.

The terms used in the specification are for describing embodiments and are not intended to limit the disclosure. In the specification, the singular form also includes the plural form (and vice versa) unless otherwise specified. The terms "comprises", "comprising", "has", "have", "having", "includes", "including", and the like do not exclude the presence or addition of one or more other components, steps, operations, and/or elements to the described component, step, operation, and/or element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The term "coupling" or "connection" may collectively mean a physical and/or electrical coupling or connection. This may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote the same components throughout the specification.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

Although the terms first, second, and the like are used to describe various components, these components are not limited by these terms. These terms are used only to distinguish one component from another component. Therefore, a first component described below may be a second component within the technical spirit of the disclosure.

"About", "approximately", "substantially", and the like, as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the disclosure are described in detail with reference to the accompanying drawings.

Figure 2:
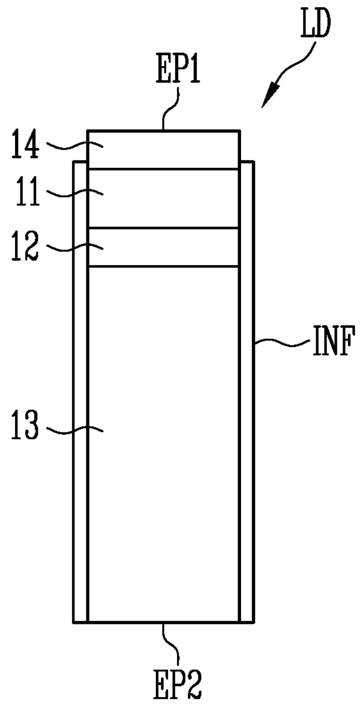

FIGS. 1 and 2 are schematic perspective and cross-sectional views illustrating a light emitting element according to an embodiment. FIGS. 1 and 2 show a column shape light emitting element LD, but a type and/or a shape of the light emitting element LD are not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

According to an embodiment, the light emitting element LD may be a light emitting element manufactured in a column shape through an etching method or the like. In the specification, the column shape may include a rod-like shape or a bar-like shape of an aspect ratio greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto. The size of the light emitting element LD may be variously changed according to a design condition of various devices using a light emitting device using the light emitting element LD as a light source (e.g., a display device).

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, AlN, and InN, and may include a p-type semiconductor layer doped with a first conductivity type dopant such as Mg. However, the material configuring the first semiconductor layer 11 is not limited thereto, and various other materials may configure the first semiconductor layer 11.

The active layer 12 may be disposed between the first semiconductor layer 11 and the second semiconductor layer 13 and may be formed in a single-quantum well or multi-quantum well structure. A position of the active layer 12 may be variously changed according to the type of the light emitting element LD. According to an embodiment, a material of AlGaN, InAlGaN, or the like may be used to form the active layer 12, and various other materials may configure the active layer 12. A clad layer (not shown) doped with a conductive dopant may be formed on and/or under the active layer 12. For example, the clad layer may be formed of AlGaN or InAlGaN.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include at least one semiconductor material among InAlGaN, GaN, AlGaN, InGaN, AlN, and InN, and may include an n-type semiconductor layer doped with a second conductivity type dopant such as Si, Ge, and/or Sn. However, the material configuring the second semiconductor layer 13 is not limited thereto, and the second semiconductor layer 13 may be configured of various other materials.

In case that a voltage equal to or greater than a threshold voltage is applied to ends of the light emitting element LD, an electron-hole pair may be combined in the active layer 12 and thus the light emitting element LD may emit light. By controlling emission of the light emitting element LD using such a principle, the light emitting element LD may be used as a light source of various light emitting devices including a pixel of a display device.

The electrode layer 14 may be disposed on the first end portion EP1 and/or the second end portion EP2 of the light emitting element LD. FIG. 2 illustrates a case in which the electrode layer 14 may be formed on the first semiconductor layer 11, but is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), zinc oxide (ZnO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted to the outside of the light emitting element LD.

The light emitting element LD may further include an insulating film INF formed on a surface. The insulating film INF may be disposed (e.g., directly disposed) on the surface of the first semiconductor layer 11, the active layer 12, the second semiconductor layer 13, and/or the electrode layer 14. The insulating film INF may expose the first and second end portions EP1 and EP2 of the light emitting element LD having different polarities. According to an embodiment, the insulating film INF may expose a side portion of the electrode layer 14 and/or the second semiconductor layer 13 adjacent to the first and second end portions EP1 and EP2 of the light emitting element LD.

The insulating film INF may include at least one of aluminum oxide (AlOx), aluminum nitride (AlNx), silicon oxide (SiOx), silicon nitride (SiNx), silicon oxynitride (SiOxNy), zirconium oxide (ZrOx), hafnium oxide (HfOx), and titanium oxide (TiOx). For example, the insulating film INF may be configured of a double layer, and each layer configuring the double layer may include different materials. Each layer configuring the double layer of the insulating film INF may be formed by different processes. In an embodiment, the insulating film INF may be configured of a double layer configured of aluminum oxide (AlOx) and silicon oxide (SiOx), but is not limited thereto. According to an embodiment, the insulating film INF may be omitted.

In case that the insulating film INF is provided on the surface of the light emitting element LD, the active layer 12 may be prevented from being short-circuited with at least one electrode (for example, at least one of electrodes connected to both ends of the light emitting element LD), or the like. Accordingly, electrical stability of the light emitting element LD may be secured. Device life and efficiency may be improved by minimizing a surface defect of the light emitting element LD.

A light emitting device including the light emitting element LD described above may be used in various types of devices that require a light source, including a display device. For example, multiple light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
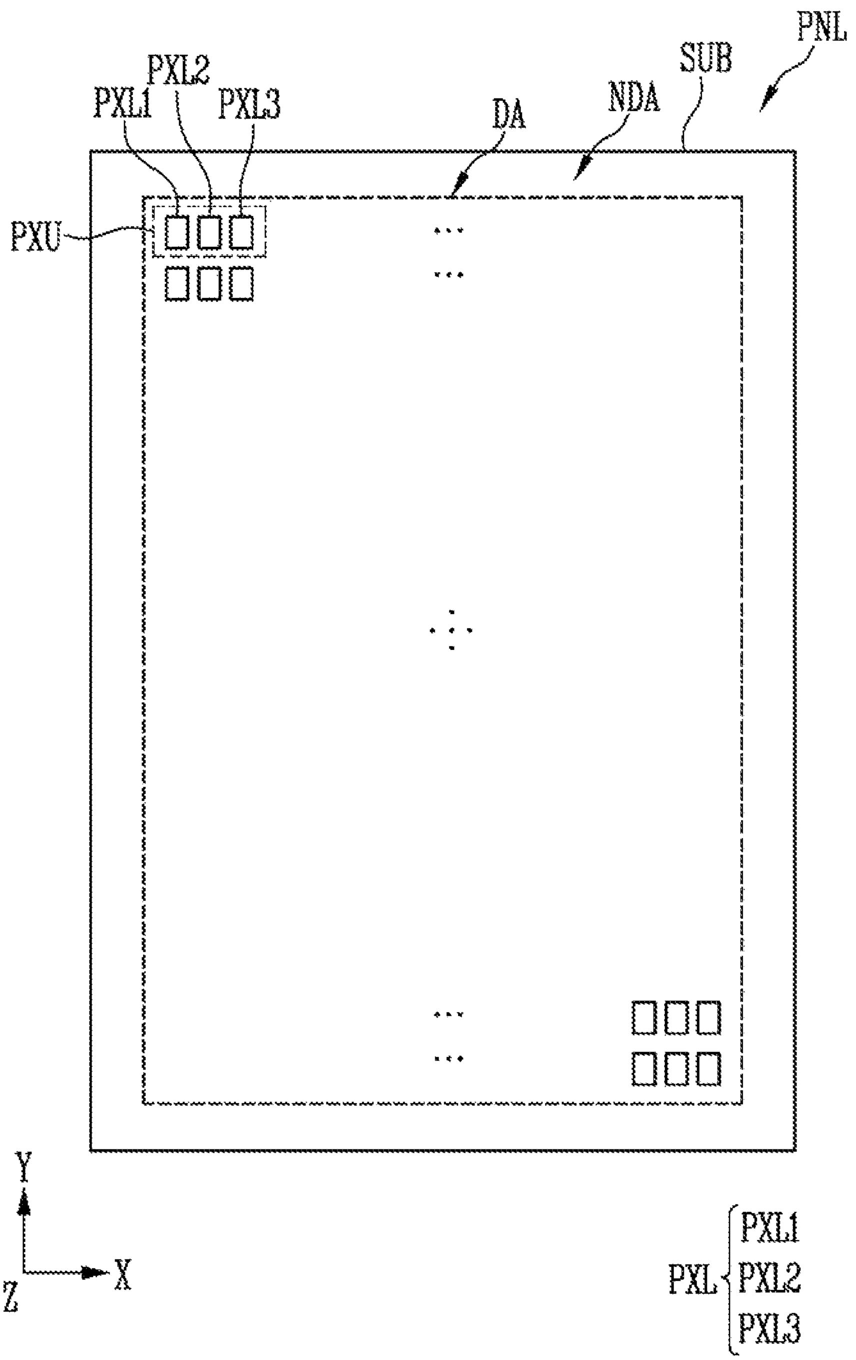
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described in the embodiments of FIGS. 1 and 2 as a light source, a display device, in particular, a display panel PNL provided in the display device is shown.

Each pixel unit PXU of the display panel PNL and each pixel configuring each pixel unit PXU may include at least one light emitting element LD. For convenience of description, in FIG. 3, a structure of the display panel PNL is briefly shown based on a display area DA. However, according to an embodiment, at least one driving circuit unit (for example, at least one of a scan driver and a data driver), lines, and/or pads, which are not shown, may be further disposed on the display panel PNL.

Referring to FIG. 3, the display panel PNL may include a substrate SUB and a pixel unit PXU disposed on the substrate SUB. The pixel unit PXU may include first pixels PXL1, second pixels PXL2, and/or third pixels PXL3. Hereinafter, when at least one pixel among the first pixels PXL1, the second pixels PXL2, and the third pixels PXL3 is arbitrarily referred to, or when two or more types of pixels are collectively referred to, at least one or two or more types of pixels may be referred to as a "pixel (PXL)" or "pixels PXL".

The substrate SUB may configure a base member of the display panel PNL, and may be a rigid or flexible substrate or film. For example, the substrate SUB may be a rigid substrate formed of glass or tempered glass, or a flexible substrate (or a thin film) of a plastic or metal material, and the material and/or a physical property of the substrate SUB are not limited.

The display panel PNL and the substrate SUB for forming the display panel PNL may include the display area DA for displaying an image and a non-display area NDA except for the display area DA. The pixels PXL may be disposed in the display area DA. Various lines, pads, and/or a built-in circuit unit connected to the pixels PXL of the display area DA may be disposed in the non-display area NDA. The pixels PXL may be regularly arranged according to a stripe or PenTile® arrangement structure, or the like. However, the arrangement structure of the pixels PXL is not limited thereto, and the pixels PXL may be arranged in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 arranged to be adjacent to each other may configure one pixel unit PXU capable of emitting light of various colors. For example, each of the first to third pixels PXL1, PXL2, and PXL3 may be a sub pixel emitting light of a color. According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include light emitting elements that emit light of a same color, and may include a color conversion layer and/or a color filter of different colors disposed on the respective light emitting element, to emit light of the first color, the second color, and the third color, respectively. In another embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color, type, number, and/or the like of pixels PXL configuring each pixel unit PXU are not limited. For example, the color of light emitted by each pixel PXL may be variously changed.

The pixel PXL may include at least one light source driven by a control signal (for example, a scan signal and a data signal) and/or power (for example, first power and second power). In an embodiment, the light source may include at least one light emitting element LD according to any one of the embodiments of FIGS. 1 and 2, for example, an ultra-small column shape light emitting element LD having a size as small as a nanometer scale to a micrometer scale. However, the disclosure is not limited thereto, and various types of light emitting elements LD may be used as the light source of the pixel PXL.

In an embodiment, each pixel PXL may be configured as an active pixel. However, a type, a structure, and/or a driving method of the pixels PXL applicable to the display device are not limited. For example, each pixel PXL may be configured as a pixel of a passive or active light emitting display device of various structures and/or driving methods.

Figure 4:
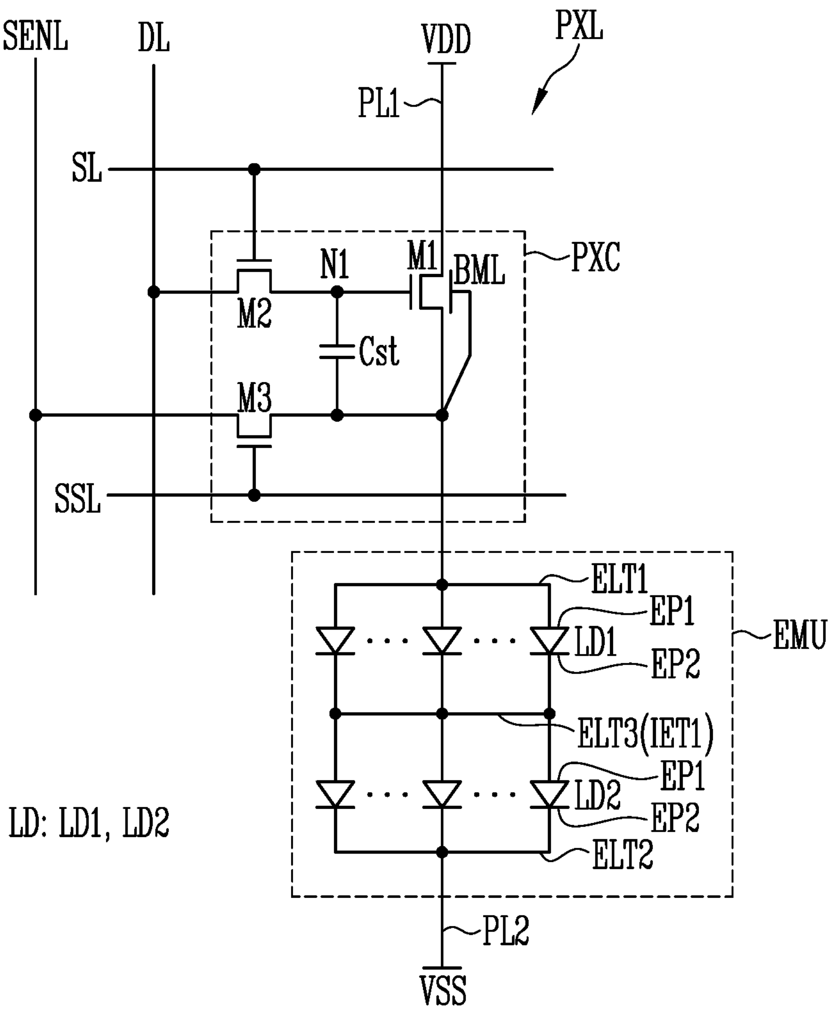
FIGS. 4 and 5 are schematic circuit diagrams illustrating a pixel according to an embodiment.
Figure 5:
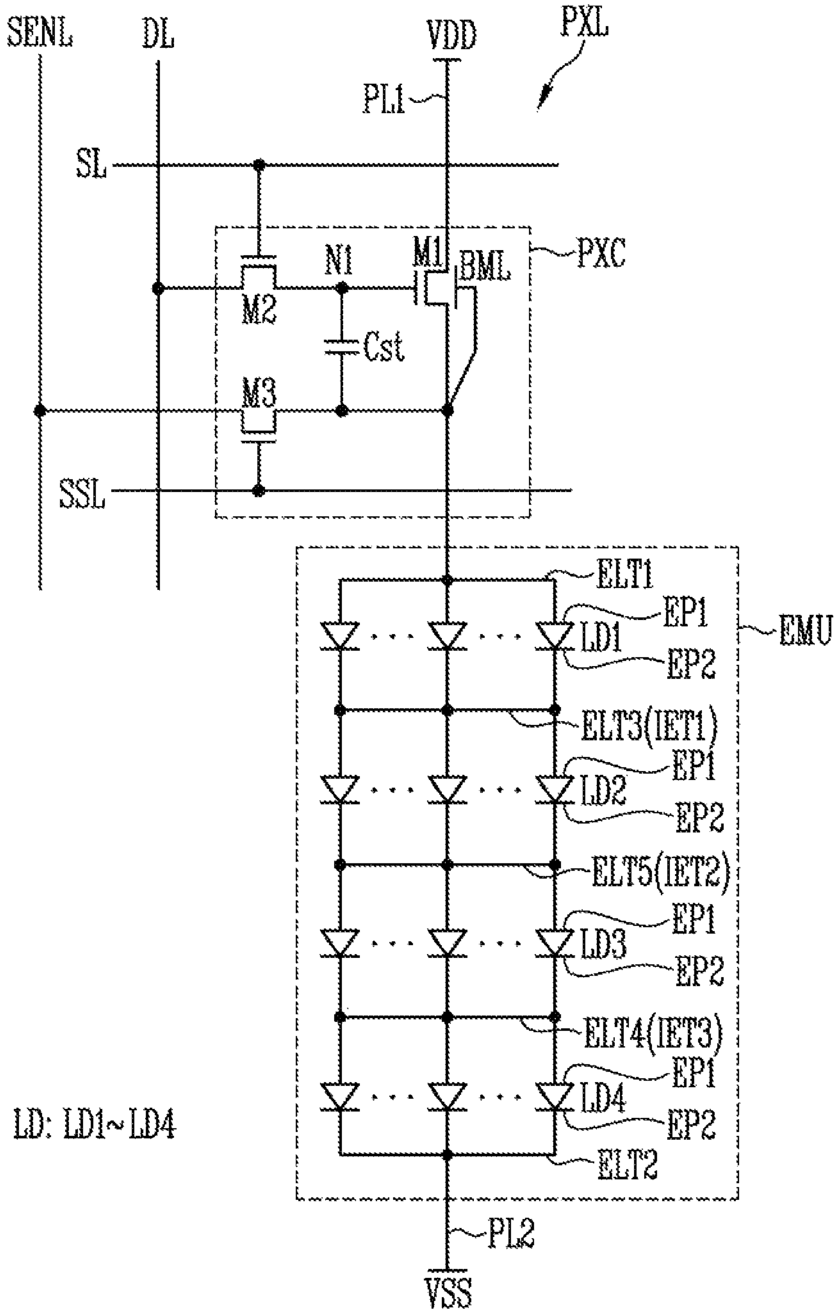

FIGS. 4 and 5 are schematic circuit diagrams illustrating a pixel according to an embodiment.

According to an embodiment, the pixel PXL shown in FIGS. 4 and 5 may be any one of the first pixel PXL1, the second pixel PXL2, and the third pixel PXL3 provided in the display panel PNL of FIG. 1. The first pixel PXL1, the second pixel PXL2, and the third pixel PXL3 may have a structure substantially the same as or similar to each other.

Referring to FIGS. 4 and 5, each pixel PXL may further include a light emitting unit EMU for generating light of a luminance corresponding to a data signal, and a pixel circuit PXC for driving the light emitting unit EMU.

The pixel circuit PXC may be connected between first power VDD and the light emitting unit EMU. The pixel circuit PXC may be connected to a scan line SL and a data line DL of the corresponding pixel PXL, and may control an operation of the light emitting unit EMU in response to a scan signal and a data signal supplied from the scan line SL and the data line DL. The pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power VDD and a first pixel electrode ELT1. A gate electrode of the first transistor M1 may be connected to a first node N1. The first transistor M1 may control a driving current supplied to the light emitting unit EMU in response to a voltage of the first node N1. For example, the first transistor M1 may be a driving transistor that controls the driving current of the pixel PXL.

In an embodiment, the first transistor M1 may selectively include a bottom metal layer BML (also referred to as a "lower electrode", a "back gate electrode", or a "lower light blocking layer"). The gate electrode of the first transistor M1 and the lower metal layer BML may overlap each other with an insulating layer interposed therebetween. In an embodiment, the lower metal layer BML may be connected to one electrode of the first transistor M1, for example, a source or drain electrode.

In a case where the first transistor M1 includes the lower metal layer BML, in case of driving the pixel PXL, a back-biasing technology (or sync technology) of moving a threshold voltage of the first transistor M1 in a negative direction or a positive direction by applying a back-biasing voltage to the lower metal layer BML of the first transistor M1 may be applied. For example, the threshold voltage of the first transistor M1 may move in the negative direction or the positive direction by applying a source-sync technology by connecting the lower metal layer BML to the source electrode of the first transistor M1. In case that the lower metal layer BML is disposed under a semiconductor pattern configuring a channel of the first transistor M1, the lower metal layer BML may serve as a light blocking pattern and stabilize an operation characteristic of the first transistor M1. However, a function and/or a utilization method of the lower metal layer BML are not limited thereto.

The second transistor M2 may be connected between the data line DL and the first node N1. A gate electrode of the second transistor M2 may be connected to the scan line SL. The second transistor M2 may be turned on in case that a scan signal of a gate-on voltage (for example, a high level voltage) is supplied from the scan line SL, to electrically connect the data line DL and the first node N1.

For each frame period, a data signal of a corresponding frame may be supplied to the data line DL, and the data signal may be transmitted to the first node N1 through the turned on second transistor M2 during a period in which the scan signal of the gate-on voltage is supplied. For example, the second transistor M2 may be a switching transistor for transmitting each data signal to the inside of the pixel PXL.

An electrode of the storage capacitor Cst may be connected to the first node N1, and another electrode may be connected to the second electrode of the first transistor M1. The storage capacitor Cst may charge a voltage corresponding to the data signal supplied to the first node N1 during each frame period.

The third transistor M3 may be connected between the first pixel electrode ELT1 (or the second electrode of the first transistor M1) and the sensing line SENL. A gate electrode of the third transistor M3 may be connected to the sensing signal line SSL. The third transistor M3 may transmit a voltage value applied to the first pixel electrode ELT1 to the sensing line SENL according to a sensing signal supplied to the sensing signal line SSL. The voltage value transmitted through the sensing line SENL may be provided to an external circuit (for example, a timing controller), and the external circuit may extract characteristic information (for example, the threshold voltage or the like of the first transistor M1) of each pixel PXL based on the provided voltage value. The extracted characteristic information may be used to convert image data so that a characteristic deviation between the pixels PXL is compensated.

In FIGS. 4 and 5, all transistors included in the pixel circuit PXC may be n-type transistors, but embodiments are not limited thereto. For example, at least one of the first, second, and third transistors M1, M2, and M3 may be changed to a p-type transistor.

A structure and a driving method of the pixel PXL may be variously changed. For example, the pixel circuit PXC may be configured of a pixel circuit of various structures and/or driving methods, in addition to an embodiment shown in FIGS. 4 and 5.

For example, the pixel circuit PXC may not include the third transistor M3. The pixel circuit PXC may additionally include at least one or more other circuit elements such as a compensation transistor for compensating for the threshold voltage or the like of the first transistor M1, an initialization transistor for initializing the voltage of the first node N1 and/or the first electrode ELT1, a emission control transistor for controlling a period in which the driving current is supplied to the light emitting unit EMU, and/or a boosting capacitor for boosting the voltage of the first node N1.

The light emitting unit EMU may include at least one light emitting element LD connected between the first power VDD and second power VSS, for example, multiple light emitting elements LD.

For example, the light emitting unit EMU may include the first pixel electrode ELT1 connected to the first power VDD through the pixel circuit PXC and a first power line PL1, a second pixel electrode ELT2 connected to the second power VSS through a second power line PL2, and the light emitting elements LD connected between the first and second pixel electrodes ELT1 and ELT2.

The first power VDD and the second power VSS may have different potentials so that the light emitting elements LD may emit light. For example, the first power VDD may be set as a high potential power, and the second power VSS may be set as a low potential power.

In an embodiment, the light emitting unit EMU may include at least one series stage. Each series stage may include a pair of electrodes (for example, two electrodes) and at least one light emitting element LD connected in a forward direction between the pair of electrodes. Here, the number of series stages configuring the light emitting unit EMU and the number of light emitting elements LD configuring each series stage are not particularly limited. For example, the number of light emitting elements LD configuring each series stage may be the same or different from each other, and the number of the light emitting elements LD is not particularly limited.

Referring to FIG. 4, the light emitting unit EMU may include a first series stage including at least one first light emitting element LD1 and a second series stage including at least one second light emitting element LD2.

The first series stage may include the first pixel electrode ELT1, a third pixel electrode ELT3, and at least one first light emitting element LD1 connected between the first and third pixel electrodes ELT1 and ELT3. Each first light emitting element LD1 may be connected in a forward direction between the first and third pixel electrodes ELT1 and ELT3. For example, the first end portion EP1 of the first light emitting element LD1 may be connected to the first pixel electrode ELT1, and the second end portion EP2 of the first light emitting element LD1 may be connected to the third pixel electrode ELT3. The third pixel electrode ELT3 may configure a first intermediate electrode IET1 connecting the first series stage and the second series stage.

The second series stage may include the third pixel electrode ELT3, the second pixel electrode ELT2, and at least one second light emitting element LD2 connected between the second and third pixel electrodes ELT2 and ELT3. Each second light emitting element LD2 may be connected in the forward direction between the second and third pixel electrodes ELT2 and ELT3. For example, the first end portion EP1 of the second light emitting element LD2 may be connected to the third pixel electrode ELT3, and the second end portion EP2 of the second light emitting element LD2 may be connected to the second pixel electrode ELT2.

The number of series stages configuring each light emitting unit EMU may be variously changed according to an embodiment. For example, the light emitting unit EMU may include the light emitting elements LD divided and connected to four series stages as in an embodiment of FIG. 5.

Referring to FIG. 5, the light emitting unit EMU may include a first series stage including at least one first light emitting element LD1, a second series stage including at least one second light emitting element LD2, a third series stage including at least one third light emitting element LD3, and a fourth series stage including at least one fourth light emitting element LD4.

The first series stage may include a first pixel electrode ELT1, a third pixel electrode ELT3, and at least one first light emitting element LD1 connected between the first and third pixel electrodes ELT1 and ELT3. Each first light emitting element LD1 may be connected in the forward direction between the first and third pixel electrodes ELT1 and ELT3. For example, the first end portion EP1 of the first light emitting element LD1 may be connected to the first pixel electrode ELT1, and the second end portion EP2 of the first light emitting element LD1 may be connected to the third pixel electrode ELT3.

The second series stage may include the third pixel electrode ELT3, a fifth pixel electrode ELT5, and at least one second light emitting element LD2 connected between the third and fifth pixel electrodes ELT3 and ELT5. Each second light emitting element LD2 may be connected in the forward direction between the third and fifth pixel electrodes ELT3 and ELT5. For example, the first end portion EP1 of the second light emitting element LD2 may be connected to the third pixel electrode ELT3, and the second end portion EP2 of the second light emitting element LD2 may be connected to the fifth pixel electrode ELT5.

The third series stage may include the fifth pixel electrode ELT5, a fourth pixel electrode ELT4, and at least one third light emitting element LD3 connected between the fourth and fifth pixel electrodes ELT4 and ELT5. Each third light emitting element LD3 may be connected in the forward direction between the fourth and fifth pixel electrodes ELT4 and ELT5. For example, the first end portion EP1 of the third light emitting element LD3 may be connected to the fifth pixel electrode ELT5, and the second end portion EP2 of the third light emitting element LD3 may be connected to the fourth pixel electrode ELT4.

The fourth series stage may include the fourth pixel electrode ELT4, a second pixel electrode ELT2, and at least one fourth light emitting element LD4 connected between the second and fourth pixel electrodes ELT2 and ELT4. Each fourth light emitting element LD4 may be connected in the forward direction between the second and fourth pixel electrodes ELT2 and ELT4. For example, the first end portion EP1 of the fourth light emitting element LD4 may be connected to the fourth pixel electrode ELT4, and the second end portion EP2 of the fourth light emitting element LD4 may be connected to the second pixel electrode ELT2.

A first electrode of the light emitting unit EMU, for example, the first pixel electrode ELT1 may be an anode electrode of the light emitting unit EMU. A last electrode of the light emitting unit EMU, for example, the second pixel electrode ELT2, may be a cathode electrode of the light emitting unit EMU.

Remaining electrodes of the light emitting unit EMU, for example, the third pixel electrode ELT3, the fourth pixel electrode ELT4, and/or the fifth pixel electrode ELT5 may configure each intermediate electrode. For example, the third pixel electrode ELT3 may configure a first intermediate electrode IET1, the fifth pixel electrode ELT5 may configure a second intermediate electrode IET2, and the fourth pixel electrode ELT4 may configure a third intermediate electrode IET3.

In case that the light emitting elements LD are connected in a series/parallel structure, power efficiency may be improved compared to a case where a same number of light emitting elements LD may be connected only in parallel. In the pixel PXL in which the light emitting elements LD may be connected in the series/parallel structure, since a luminance may be expressed through the light emitting elements LD of a remaining series stage even though a short defect or the like occurs at some of the series stages, a possibility of a dark spot defect of the pixel PXL may be reduced. However, the disclosure is not limited thereto, and the light emitting unit EMU may be configured by connecting the light emitting elements LD only in series, or the light emitting unit EMU may be configured by connecting the light emitting elements LD only in parallel.

Each of the light emitting elements LD may include the first end portion EP1 (for example, a p-type end portion) connected to the first power VDD via at least one electrode (for example, the first pixel electrode ELT1), the pixel circuit PXC, the first power line PL1, and/or the like, and the second end portion EP2 (for example, an n-type end portion) connected to the second power VSS via at least another electrode (for example, the second pixel electrode ELT2), the second power line PL2, and the like. For example, the light emitting elements LD may be connected in the forward direction between the first power VDD and the second power VSS. The light emitting elements LD connected in the forward direction may configure effective light sources of the light emitting unit EMU.

In case that the driving current is supplied through the corresponding pixel circuit PXC, the light emitting elements LD may emit light with a luminance corresponding to the driving current. For example, during each frame period, the pixel circuit PXC may supply the driving current corresponding to a grayscale value to be expressed in the corresponding frame to the light emitting unit EMU. Accordingly, while the light emitting elements LD emit light with the luminance corresponding to the driving current, the light emitting unit EMU may express the luminance corresponding to the driving current.

Figure 6:
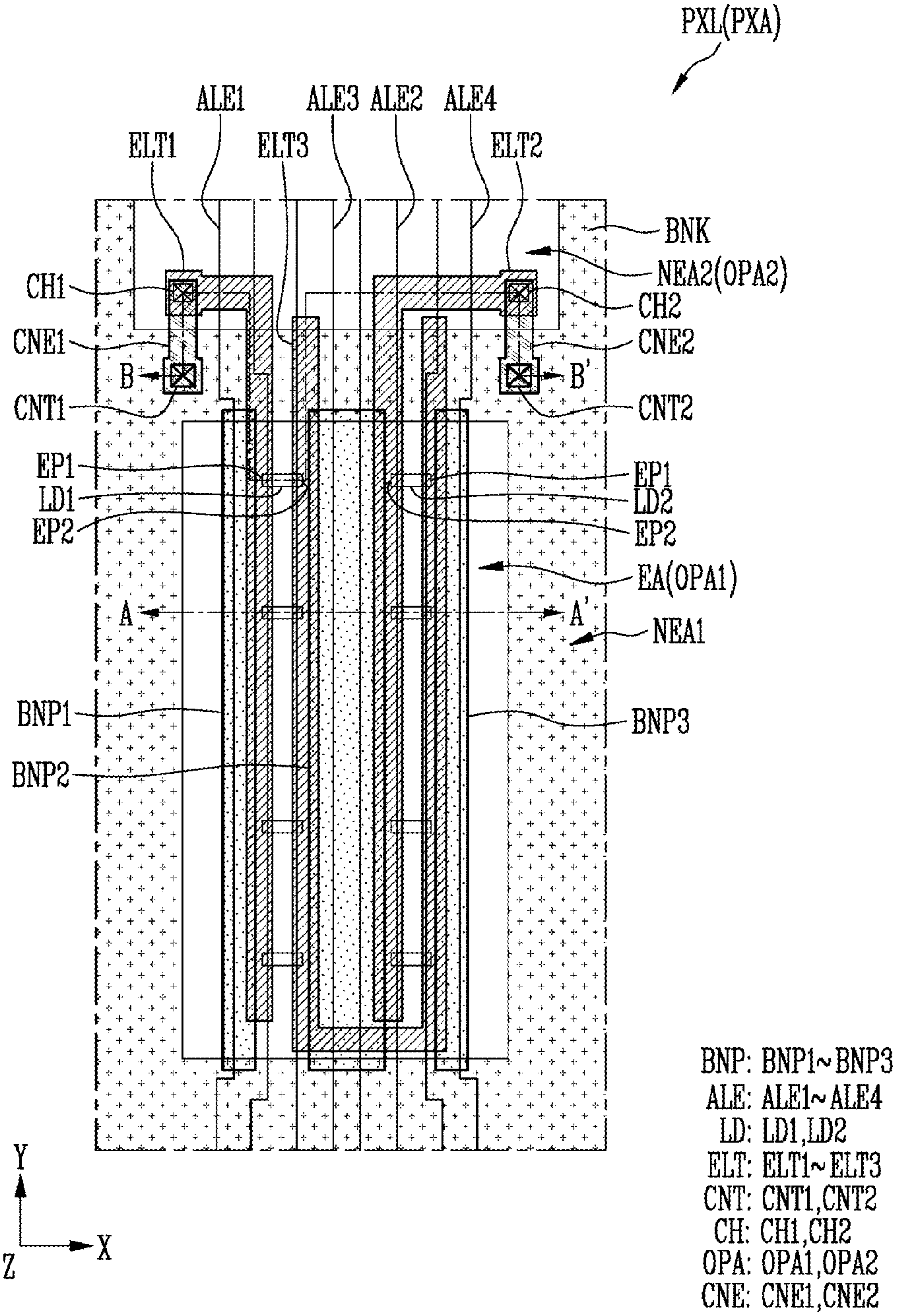
FIG. 6 is a schematic plan view illustrating a pixel according to an embodiment.
Figure 7:
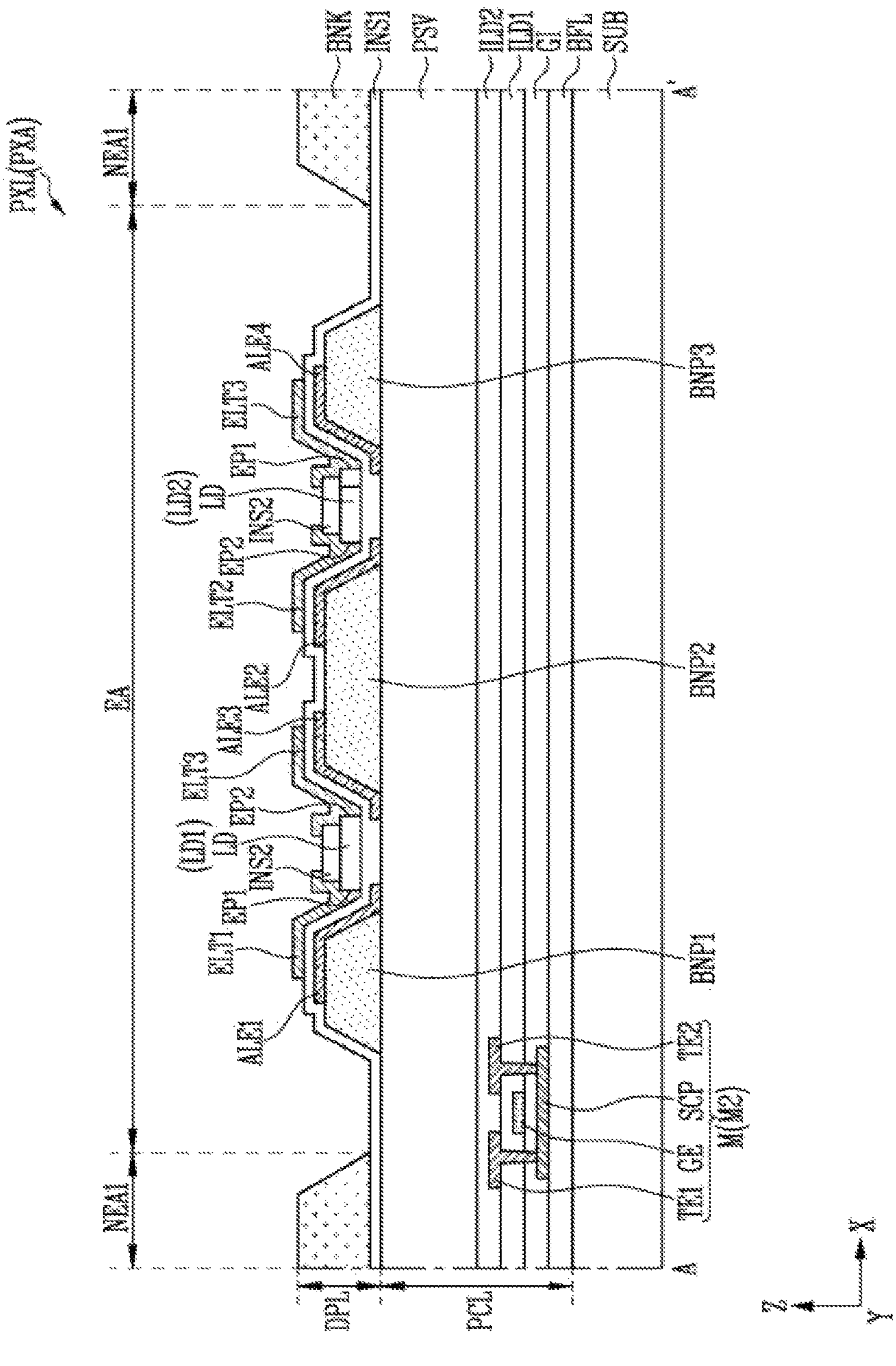
FIGS. 7 and 8 are schematic cross-sectional views taken along line A-A' of FIG. 6.
Figure 8:
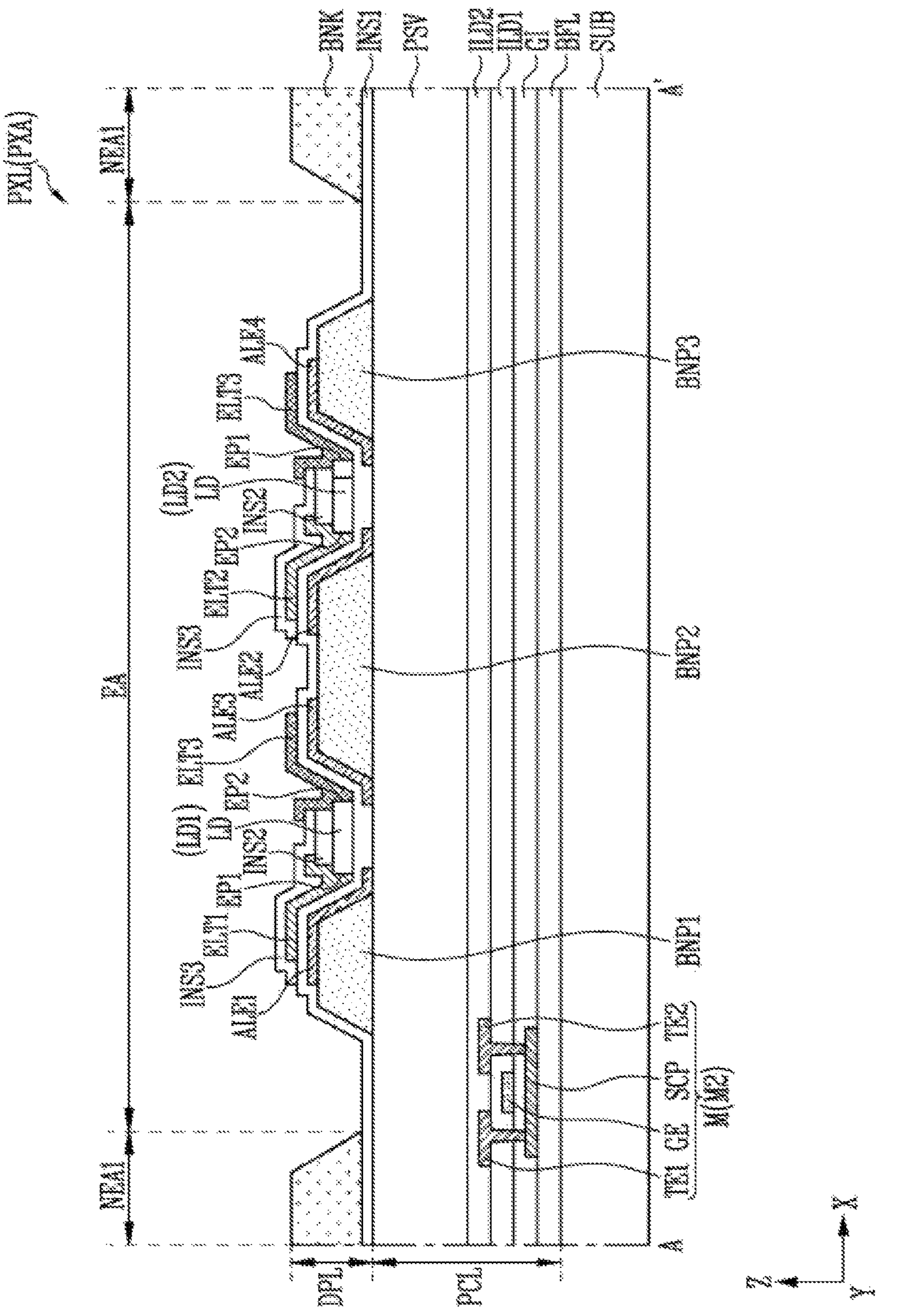
Figure 9:
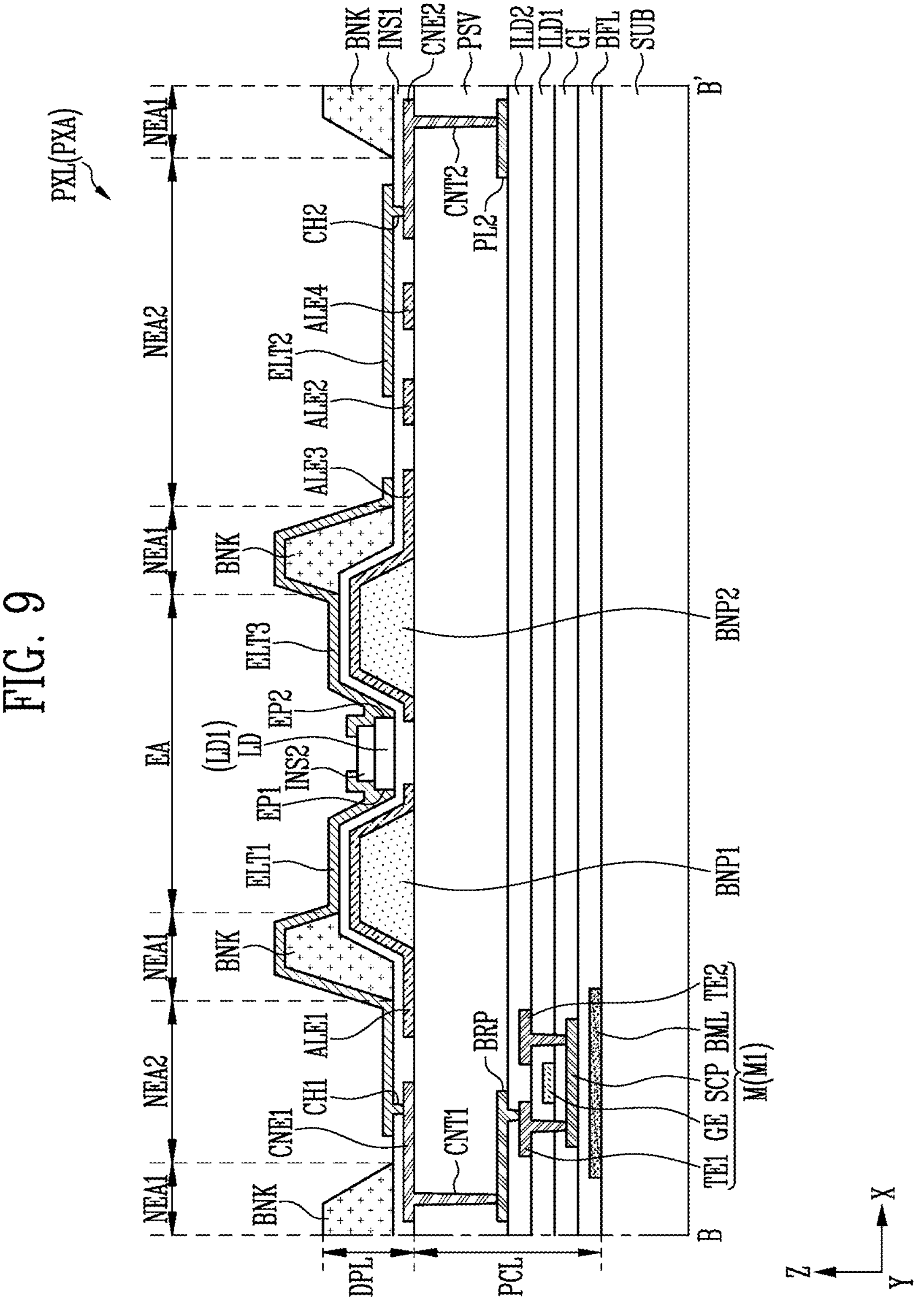
FIG. 9 is a schematic cross-sectional view taken along line B-B' of FIG. 6.

FIG. 6 is a schematic plan view illustrating a pixel according to an embodiment. FIGS. 7 and 8 are schematic cross-sectional views taken along line A-A' of FIG. 6. FIG. 9 is a cross-sectional view taken along line B-B' of FIG. 6.

For example, FIG. 6 may be any one of the first to third pixels PXL1, PXL2, and PXL3 configuring the pixel unit PXU of FIG. 3, and the first to third pixels PXL1, PXL2, and PXL3 may have substantially a same or similar structure to each other. FIG. 6 discloses an embodiment in which each pixel PXL includes the light emitting elements LD disposed at two series stages, as shown in FIG. 4, but the number of series stages of each pixel PXL may be variously changed according to an embodiment.

Hereinafter, when one or more of the first and second light emitting elements LD1 and LD2 are arbitrarily referred to, or when two or more types of light emitting elements are collectively referred to, the one or more of the first and second light emitting elements LD1 and LD2 or two or more types of light emitting elements may be referred to as a "light emitting element LD" or "light emitting elements LD". When at least one of alignment electrodes including first to fourth alignment electrodes ALE1, ALE2, ALE3, and ALE4 is arbitrarily referred to, the at least one of alignment electrodes ALE1, ALE2, ALE3, and ALE4 is referred to as an "alignment electrode ALE", "alignment electrodes ALE", or "first electrodes", and when at least one of pixel electrodes including the first to third pixel electrodes ELT1 to ELT3 is arbitrarily referred to, the at least one of pixel electrodes ELT1 to ELT3 is referred to as a "pixel electrode ELT", "pixel electrodes ELT", or "second electrodes".

Referring to FIG. 6, each pixel PXL may include an emission area EA, a first non-emission area NEA1, and a second non-emission area NEA2. The emission area EA may be an area including the light emitting elements LD and emit light. The first non-emission area NEA1 may be disposed to surround the emission area EA. The first non-emission area NEA1 may be an area in which a bank BNK surrounding the emission area EA may be provided. The second non-emission area NEA2 may be spaced apart from the emission area EA with the first non-emission area NEA1 interposed therebetween.

Each pixel PXL may include the patterns BNP, the alignment electrodes ALE, the light emitting elements LD, the pixel electrodes ELT, and connection electrodes CNE.

The patterns BNP may be provided in at least emission area EA. The patterns BNP may extend in a second direction (Y-axis direction) and may be spaced apart from each other in a first direction (X-axis direction).

Each of the patterns BNP (also referred to as a "wall pattern" or a "bank pattern") may partially overlap at least one alignment electrode ALE in at least emission area EA. For example, a first pattern BNP1 may be provided under the first alignment electrode ALE1 to overlap a region of the first alignment electrode ALE1, a second pattern BNP2 may be provided under the second and third alignment electrodes ALE2 and ALE3 to overlap a region of the second and third alignment electrodes ALE2 and ALE3, and a third pattern BNP3 may be provided under the fourth alignment electrode ALE4 to overlap a region of the fourth alignment electrodes ALE4.

As the patterns BNP may be provided under a region of each of the alignment electrodes ALE, a region of each of the alignment electrodes ALE may be protruded in an upper direction of the pixel PXL, that is, a third direction (Z-axis direction) in a region in which the patterns BNP may be formed. In case that the patterns BNP and/or the alignment electrodes ALE include a reflective material, a reflective wall structure may be formed around the light emitting elements LD. Accordingly, since the light emitted from the light emitting elements LD may be emitted to the upper direction of the pixel PXL (for example, in a front direction of the display panel PNL including a viewing angle range), emission efficiency of the display panel PNL may be improved.

The alignment electrodes ALE may be provided in at least emission area EA. The alignment electrodes ALE may extend along the second direction (Y-axis direction) and may be spaced apart from each other along the first direction (X-axis direction). The alignment electrodes ALE may extend from the emission area EA to the second non-emission area NEA2 through the first non-emission area NEA1.

Each of the alignment electrodes ALE may be positioned on at least one of the patterns BNP. For example, the first alignment electrode ALE1 may be positioned on a region of the first pattern BNP1, the second and third alignment electrodes ALE2 and ALE3 may be positioned on different regions of the second pattern BNP2, and the fourth alignment electrode ALE4 may be positioned on a region of the third pattern BNP3. In an embodiment, in case that the third alignment electrode ALE3 is positioned between the first and second alignment electrodes ALE1 and ALE2, the third alignment electrode ALE3 may be positioned in a side (or left) region of the second pattern BNP2, and the second alignment electrode ALE2 may be positioned in another side (or right) region of the second pattern BNP2.

A pair of alignment electrodes ALE adjacent to each other may receive different signals during an alignment step of the light emitting elements LD. For example, in case that the first alignment electrode ALE1, the third alignment electrode ALE3, the second alignment electrode ALE2, and the fourth alignment electrode ALE4 may be sequentially arranged along the first direction (X-axis direction) in the emission area EA, the first and third alignment electrodes ALE1 and ALE3 may form a pair and receive different alignment signals, and the second and fourth alignment electrodes ALE2 and ALE4 may form a pair and receive different alignment signals.

In an embodiment, the second and third alignment electrodes ALE2 and ALE3 may receive a same signal in the alignment step of the light emitting elements LD. The second and third alignment electrodes ALE2 and ALE3 may be integrally or non-integrally connected to each other in the alignment step of the light emitting elements LD, but are not limited thereto.

In an embodiment, the alignment electrodes ALE may be electrically separated from the pixel electrodes ELT and/or the connection electrodes CNE, which will be described later. Accordingly, signal interference may be prevented in a process of aligning the light emitting elements LD, and the circuit layer PCL of FIG. 6 including the pixel circuit PXC or the display layer DPL of FIG. 6 including the alignment electrodes ALE may be repaired independently even though a defect occurs in the circuit layer PCL of FIG. 6 including the pixel circuit PXC or the display layer DPL of FIG. 6 including the alignment electrodes ALE. A detailed description of this is described later.

Each of the light emitting elements LD may be aligned between a pair of patterns BNP in the emission area EA. Each of the light emitting elements LD may be electrically connected between a pair of pixel electrodes ELT.

The first light emitting element LD1 may be aligned between the first and second patterns BNP1 and BNP2. The first light emitting element LD1 may be electrically connected between the first and third pixel electrodes ELT1 and ELT3. For example, the first light emitting element LD1 may be aligned between the first and second patterns BNP1 and BNP2, the first end portion EP1 of the first light emitting element LD1 may be electrically connected to the first pixel electrode ELT1, and the second end portion EP2 of the first light emitting element LD1 may be electrically connected to the third pixel electrode ELT3.

The second light emitting element LD2 may be aligned between the second and third patterns BNP2 and BNP3. The second light emitting element LD2 may be electrically connected between the second and third pixel electrodes ELT2 and ELT3. For example, the second light emitting element LD2 may be aligned between the second and third patterns BNP2 and BNP3, the first end portion EP1 of the second light emitting element LD2 may be electrically connected to the third pixel electrode ELT3, and the second end portion EP2 of the second light emitting element LD2 may be electrically connected to the second pixel electrode ELT2.

For example, the first light emitting element LD1 may be positioned in a left region of the emission area EA, and the second light emitting element LD2 may be positioned in a right region of the emission area EA. However, an arrangement, a connection structure, and/or the like of the light emitting elements LD may be variously changed according to a structure of the light emitting unit EMU, the number of series stages, and/or the like.

Each of the pixel electrodes ELT may be provided in at least emission area EA, and may be disposed to overlap at least one alignment electrode ALE and/or the light emitting element LD. For example, the pixel electrode ELT may be formed on the alignment electrodes ALE and/or the light emitting elements LD to overlap the alignment electrodes ALE and/or the light emitting elements LD, respectively, and may be electrically connected to the light emitting elements LD.

The first pixel electrode ELT1 may be disposed on the first end portions EP1 of the first light emitting elements LD1 and may be electrically connected to the first end portions EP1 of the first light emitting elements LD1.

The second pixel electrode ELT2 may be disposed on the second end portions EP2 of the second light emitting elements LD2 and may be electrically connected to the second end portions EP2 of the second light emitting elements LD2. The second pixel electrode ELT2 may be electrically connected to the first light emitting elements LD1 via at least another pixel electrode ELT and/or the light emitting element LD. For example, the second pixel electrode ELT2 may be electrically connected to the second end portions EP2 of the first light emitting elements LD1 via the third pixel electrode ELT3.

The third pixel electrode ELT3 may be disposed on the second end portions EP2 of the first light emitting elements LD1 and may be electrically connected to the second end portions EP2 of the first light emitting elements LD1. The third pixel electrode ELT3 may be disposed on the first end portions EP1 of the second light emitting elements LD2 and may be electrically connected to the first end portions EP1 of the second light emitting elements LD2. For example, the third pixel electrode ELT3 may electrically connect the second end portions EP2 of the first light emitting elements LD1 and the first end portions EP1 of the second light emitting elements LD2 in the emission area EA. To this end, the third pixel electrode ELT3 may have a curved shape. For example, the third pixel electrode ELT3 may have a curved or bent structure at a boundary between a region in which at least one first light emitting element LD1 is arranged and a region in which at least one second light emitting element LD2 is arranged.

The third pixel electrode ELT3 may be positioned between the first and second pixel electrodes ELT1 and ELT2, and may be electrically connected between the first and second pixel electrodes ELT1 and ELT2 through the light emitting elements LD. For example, the third pixel electrode ELT3 may be connected to the first pixel electrode ELT1 through at least one first light emitting element LD1, and may be connected to the second pixel electrode ELT2 through at least one second light emitting element LD2.

In an embodiment, each of the pixel electrodes ELT may extend from the emission area EA to the second non-emission area NEA2 through the first non-emission area NEA1, and may be electrically connected to at least one connection electrode CNE through the contact hole CH in the second non-emission area NEA2. For example, the first pixel electrode ELT1 may be electrically connected to a first connection electrode CNE1 through a first contact hole CH1 positioned in the second non-emission area NEA2, and the second pixel electrode ELT2 may be electrically connected to a second connection electrode CNE2 through a second contact hole CH2 positioned in the second non-emission area NEA2. As described above, in case that the contact holes CH are disposed in the second non-emission area NEA2, since the contact holes CH may be formed by avoiding the emission area EA to which the light emitting elements LD may be supplied and aligned, in the step of aligning the light emitting elements LD, a more uniform electric field may be formed in the emission area EA, and separation of the light emitting elements LD may be prevented.

The connection electrodes CNE may be disposed in the first non-emission area NEA1 and/or the second non-emission area NEA2. For example, the connection electrodes CNE may at least partially overlap the bank BNK on a plane.

The connection electrodes CNE may be connected to the pixel circuit PXC and/or a power line through a contact portion CNT. The contact portion CNT may be provided in the first non-emission area NEA1, but is not limited thereto.

The first connection electrode CNE1 may be connected to the pixel circuit PXC and/or the first power line PL1 through the first contact portion CNT1, and the second connection electrode CNE2 may be connected to the second power line PL2 through the second contact portion CNT2. Accordingly, the pixel electrodes ELT may be connected to the pixel circuit PXC and/or the power line through the connection electrodes CNE. For example, the first pixel electrode ELT1 may be electrically connected to the pixel circuit PXC and/or the first power line PL1 through the first connection electrode CNE1, and the second pixel electrode ELT2 may be electrically connected to the second power line PL2 through the second connection electrode CNE2. The connection electrodes CNE and/or the pixel electrodes ELT may be electrically separated from the above-described alignment electrodes ALE.

For example, the pixel electrodes ELT may be electrically separated from the alignment electrodes ALE, and may be connected to the pixel circuit PXC and/or the power line through the connection electrodes CNE. Accordingly, the circuit layer PCL of FIG. 6 including the pixel circuit PXC or the display layer DPL of FIG. 6 including the alignment electrodes ALE may be repaired independently even though a defect occurs in the circuit layer PCL of FIG. 6 including the pixel circuit PXC or the display layer DPL of FIG. 6 including the alignment electrodes ALE. According to an embodiment, at least one pair of the pixel electrodes ELT and the alignment electrodes ALE overlapping each other may receive different signals. For example, the first pixel electrode ELT1 and the first alignment electrode ALE1 overlapping each other may receive different signals. In other embodiments, the second pixel electrode ELT2 and the second alignment electrode ALE2 overlapping each other may receive different signals, but embodiments are not limited thereto.

The connection electrodes CNE may be disposed so as not to overlap the alignment electrodes ALE on a plane. For example, the first connection electrode CNE1 may be spaced apart from the first alignment electrode ALE1 in the first direction (X-axis direction), and the second connection electrode CNE2 may be spaced apart from the fourth alignment electrode ALE4 in the first direction (X-axis direction), but is not limited thereto.

The bank BNK may be provided in the first non-emission area NEA1 to surround the emission area EA and the second non-emission area NEA2. The bank BNK may be provided in an outer portion of each pixel area PXA and/or between adjacent pixel areas PXA so as to include multiple openings OPA corresponding to the emission area EA and the second non-emission area NEA2 of the pixel PXL. For example, the bank BNK may include a first opening OPA1 overlapping the emission area EA and a second opening OPA2 overlapping the second non-emission area NEA2. For example, the bank BNK may include the first opening OPA1 defining the emission area EA and the second opening OPA2 defining the second non-emission area NEA2.

The bank BNK may form a dam structure defining the emission area EA to which the light emitting elements LD may be supplied in a step of supplying the light emitting elements LD to each of the pixels PXL. For example, as the emission area EA is partitioned by the bank BNK, a desired type and/or amount of light emitting element ink may be supplied to the emission area EA.

The bank BNK may include at least one light blocking and/or reflective material. Accordingly, light leakage between adjacent pixels PXL may be prevented. For example, the bank BNK may include at least one black matrix material, a color filter material, and/or the like. For example, the bank BNK may be formed in a black opaque pattern capable of blocking transmission of light. In an embodiment, a reflective layer or the like, which is not shown, may be formed on a surface (for example, a sidewall) of the bank BNK so as to increase the light efficiency of each pixel PXL.

Hereinafter, a cross-sectional structure of each pixel PXL is described in detail with reference to FIGS. 7 to 9, centering on the light emitting element LD. FIGS. 7 and 8 show a second transistor M2 among various circuit elements configuring the pixel circuit PXC, and FIG. 9 shows a first transistor M1. Hereinafter, when the first transistor M1 and the second transistor M2 are not required to be separately specified, the first transistor M1 and the second transistor M2 are collectively referred to as a "transistor M". A structure, a position of each layer, and/or the like of the transistors M are not limited to an embodiment shown in FIGS. 7 to 9, and may be variously changed according to an embodiment.

Referring to FIGS. 7 to 9, pixels PXL and the display panel PNL including the same according to an embodiment may include the circuit layer PCL and the display layer DPL disposed on a surface of the substrate SUB.

In the circuit layer PCL, circuit elements (for example, the transistors M and the storage capacitor Cst) configuring the pixel circuit PXC of the corresponding pixel PXL, and various lines connected thereto may be disposed. In the display layer DPL, the alignment electrodes ALE configuring the light emitting unit EMU of the corresponding pixel PXL, the light emitting elements LD, and/or the pixel electrodes ELT may be disposed.

Specifically, the substrate SUB may configure a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. A material and/or a physical property of the substrate SUB are not limited. In an embodiment, the substrate SUB may be substantially transparent. Here, "substantially transparent" may mean that light may be transmitted at a transmittance or more. In another embodiment, the substrate SUB may be translucent or opaque. The substrate SUB may include a reflective material according to an embodiment.

The transistor M may be disposed on the substrate SUB. Each transistor M may include a semiconductor pattern SCP, a gate electrode GE, first and second transistor electrodes TE1 and TE2, and may selectively further include a lower metal layer BML.

The lower metal layer BML may be disposed on the substrate SUB. The lower metal layer BML may overlap the gate electrode GE and/or the semiconductor pattern SCP of at least one transistor M (for example, the first transistor M1).

A buffer layer BFL may be disposed on the substrate SUB. The buffer layer BFL may prevent an impurity from being diffused into each circuit element. The buffer layer BFL may be configured of a single layer, but may be configured of multiple layers. In case that the buffer layer BFL is formed of multiple layers, each layer may be formed of a same material or may be formed of different materials.

The semiconductor pattern SCP may be disposed on the buffer layer BFL. For example, each semiconductor pattern SCP may include a first region that is in contact with the first transistor electrode TE1, a second region that is in contact with the second transistor electrode TE2, and a channel region positioned between the first and second regions. According to an embodiment, one of the first and second regions may be a source region and the other may be a drain region.

According to an embodiment, the semiconductor pattern SCP may be formed of polysilicon, amorphous silicon, oxide semiconductor, or the like. The channel region of the semiconductor pattern SCP may be an intrinsic semiconductor as a semiconductor pattern that is not doped with an impurity. Each of the first and second regions of the semiconductor pattern SCP may be a semiconductor doped with an impurity.

A gate insulating layer GI may be disposed on the semiconductor pattern SCP. For example, the gate insulating layer GI may be disposed between the semiconductor pattern SCP and the gate electrode GE. The gate insulating layer GI may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The gate electrode GE may be disposed on the gate insulating layer GI. The gate electrode GE may be disposed to overlap the semiconductor pattern SCP in the third direction (Z-axis direction) on the gate insulating layer GI.

A first interlayer insulating layer ILD1 may be disposed on the gate electrode GE. For example, the first interlayer insulating layer ILD1 may be disposed between the gate electrode GE and the first and second transistor electrodes TE1 and TE2. The first interlayer insulating layer ILD1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The first and second transistor electrodes TE1 and TE2 may be disposed on the first interlayer insulating layer ILD1. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the first interlayer insulating layer ILD1 and the gate insulating layer GI. The second transistor electrode TE2 may be electrically connected to the second region of the semiconductor pattern SCP through a contact hole passing through the first interlayer insulating layer ILD1 and the gate insulating layer GI. According to an embodiment, one of the first and second transistor electrodes TE1 and TE2 may be a source electrode, and the other may be a drain electrode.

A second interlayer insulating layer ILD2 may be disposed on the first and second transistor electrodes TE1 and TE2. The second interlayer insulating layer ILD2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

A bridge electrode BRP and/or the second power line PL2 may be disposed on the second interlayer insulating layer ILD2. The bridge electrode BRP may be electrically connected to the first transistor electrode TE1 through a contact hole passing through the second interlayer insulating layer ILD2. The bridge electrode BRP and the second power line PL2 may be formed of a same conductive layer. For example, the bridge electrode BRP and the second power line PL2 may be simultaneously formed in a same process, but embodiments are not limited thereto. For example, according to an embodiment, the bridge electrode BRP may be omitted, and the second power line PL2 and the first and second transistor electrodes TE1 and TE2 may be formed of a same conductive layer.

A protective layer PSV may be disposed on the circuit elements including the transistors M. The protective layer PSV may be formed of an organic material to flatten a lower step difference. For example, the protective layer PSV may include an organic material such as an acrylates resin, an epoxy resin, a phenolic resin, a polyamides resin, a polyimides resin, a polyesters resin, a polyphenylenesulfides resin, and/or benzocyclobutene (BCB). However, the disclosure is not limited thereto, and the protective layer PSV may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The display layer DPL may be disposed on the protective layer PSV of the circuit layer PCL. The display layer DPL may include the connection electrodes CNE, the patterns BNP, the alignment electrodes ALE, the light emitting elements LD, and/or the pixel electrodes ELT.

The connection electrodes CNE may be disposed on the protective layer PSV. The connection electrodes CNE may be disposed on the protective layer PSV of the first and second non-emission areas NEA1 and NEA2 and may be electrically connected to the circuit elements of the circuit layer PCL. For example, the first connection electrode CNE1 may be electrically connected to the bridge electrode BRP through the first contact portion CNT1 passing through the protective layer PSV, and may be electrically connected to the transistor M through the bridge electrode BRP. However, the disclosure is not limited thereto, and as described above, in case that the bridge electrode BRP is omitted, the first connection electrode CNE1 may be electrically connected to the first transistor electrode TE1 of the transistor M through the first contact portion CNT1 passing through the protective layer PSV. The second connection electrode CNE2 may be electrically connected to the second power line PL2 through the second contact portion CNT2 passing through the protective layer PSV.

The connection electrodes CNE and the pixel electrodes ELT may be formed of a same material, which will be described later. For example, each of the connection electrodes CNE may be formed of various transparent conductive materials. For example, the connection electrodes CNE may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and/or fluorine tin oxide (FTO). In case that the connection electrodes CNE and the pixel electrodes ELT are formed of a same material, since galvanic corrosion due to contact of the connection electrodes CNE and the pixel electrodes ELT may be minimized, an RC delay may be prevented.

The patterns BNP may be disposed on the protective layer PSV. The patterns BNP may have various shapes according to an embodiment. In an embodiment, the patterns BNP may have a shape protruding from the substrate SUB in the third direction (Z-axis direction). The patterns BNP may be formed to have an inclined surface inclined at an angle with respect to the substrate SUB. However, the disclosure is not limited thereto, and the patterns BNP may have a sidewall of a curved surface, a step shape, or the like. For example, the patterns BNP may have a cross section of a semicircle shape, a semi-ellipse shape, or the like.

Electrodes and insulating layers disposed on the patterns BNP may have a shape corresponding to the patterns BNP. For example, the alignment electrodes ALE disposed on the patterns BNP may include an inclined surface or a curved surface having a shape corresponding to the shape of the patterns BNP. Accordingly, the patterns BNP may function as a reflective member that improves emission efficiency of the display panel PNL by guiding the light emitted from the light emitting elements LD in the front direction, that is, the third direction (Z-axis direction) of the pixel PXL together with the alignment electrodes ALE provided on the patterns BNP.

The patterns BNP may include at least one organic material and/or inorganic material. For example, the patterns BNP may include an organic material such as an acrylates resin, an epoxy resin, a phenolic resin, a polyamides resin, a polyimides resin, a polyesters resin, a polyphenylenesulfides resin, and/or benzocyclobutene (BCB). However, the disclosure is not limited thereto, and the patterns BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The alignment electrodes ALE may be disposed on the protective layer PSV and the patterns BNP. The alignment electrodes ALE may be disposed to be spaced apart from each other in the emission area EA. As described above, the alignment electrodes ALE may receive the alignment signal in the alignment step of the light emitting elements LD. Accordingly, the electric field may be formed between the alignment electrodes ALE, and thus the light emitting elements LD supplied to each of the pixels PXL may be aligned between the alignment electrodes ALE.

Each of the alignment electrodes ALE may include at least one conductive material. For example, the alignment electrodes ALE may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or fluorine tin oxide (FTO), and at least one conductive material among conductive polymers such as PEDOT, but is not limited thereto.

A first insulating layer INS1 may be disposed on the alignment electrodes ALE. The first insulating layer INS1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The bank BNK may be disposed on the first insulating layer INS1 of the first non-emission area NEA1. For example, the bank BNK may be provided in the first non-emission area NEA1 to surround the emission area EA and the second non-emission area NEA2.

The bank BNK may be disposed to overlap the first and/or second contact portions CNT1 and CNT2. For example, the bank BNK may be disposed to cover the first and second contact portions CNT1 and CNT2. However, the disclosure is not limited thereto, and the bank BNK may be disposed so as not to overlap the first and second contact portions CNT1 and CNT2.

The bank BNK may include at least one organic material and/or an inorganic material. For example, the bank BNK may include an organic material such as an acrylates resin, an epoxy resin, a phenolic resin, a polyamides resin, a polyimides resin, a polyesters resin, a polyphenylenesulfides resin, and/or benzocyclobutene (BCB). However, the disclosure is not limited thereto, and the bank BNK may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The light emitting elements LD may be disposed on the first insulating layer INS1 of the emission area EA. The light emitting elements LD may be disposed between the alignment electrodes ALE on the first insulating layer INS1. The light emitting elements LD may be prepared in a form dispersed in a solution, and may be supplied to each of the pixels PXL through an inkjet printing method or the like. For example, the light emitting elements LD may be dispersed in a volatile solvent and provided in the emission area of each of the pixels PXL. In the process of aligning the light emitting elements LD, in case that the alignment signal is supplied through the alignment electrodes ALE, while the electric field is formed between the alignment electrodes ALE, the light emitting elements LD may be aligned. After the light emitting elements LD may be aligned, the solvent may be volatilized or removed in another method to stably arrange the light emitting elements LD between the alignment electrodes ALE.

A second insulating layer INS2 may be disposed on the light emitting elements LD. The second insulating layer INS2 may be partially disposed on the light emitting elements LD. In case that the second insulating layer INS2 is formed on the light emitting elements LD after the alignment of the light emitting elements LD is completed, the light emitting elements LD may be prevented from being separated from an aligned position. The second insulating layer INS2 may be disposed on the light emitting elements LD, and expose the first and second end portions EP1 and EP2 of the light emitting elements LD.

The second insulating layer INS2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The pixel electrodes ELT may be disposed on the first and second end portions EP1 and EP2 of the light emitting elements LD exposed by the second insulating layer INS2. The pixel electrodes ELT may be disposed (e.g., directly disposed) on the first and second end portions EP1 and EP2 of the light emitting elements LD, and thus the pixel electrodes ELT may be in contact with the first and second end portions EP1 and EP2 of the light emitting elements LD.

The pixel electrodes ELT may be disposed on a same layer. For example, as shown in FIG. 7, the pixel electrodes ELT may be formed of a same conductive layer. The pixel electrodes ELT may be formed simultaneously in a same process, but the disclosure is not limited thereto.

In another embodiment, as shown in FIG. 8, the pixel electrodes ELT may be configured of multiple conductive layers and may be disposed on different layers. The first and second pixel electrodes ELT1 and ELT2 may be disposed on the second insulating layer INS2, and the third pixel electrode ELT3 may be disposed on the first and second pixel electrodes ELT1 and ELT2. The first pixel electrode ELT1 and the second pixel electrode ELT2 may be disposed on a same layer, and the third pixel electrode ELT3 may be disposed on a layer different from that of the first and second pixel electrodes ELT1 and ELT2. As described above, in case that the pixel electrodes ELT are configured of the multiple conductive layers, an insulating layer may be disposed between the conductive layers. For example, a third insulating layer may be further disposed between the first and second pixel electrodes ELT1 and ELT2 and the third pixel electrodes ELT3. The third insulating layer may cover the first and second pixel electrodes ELT1 and ELT2, and may expose the second end portion EP2 of the light emitting element LD. The third pixel electrode ELT3 may be disposed on the second end portion EP2 of the light emitting element LD exposed by the third insulating layer. As described above, in case that the third insulating layer is disposed between the pixel electrodes ELT formed of different conductive layers, since the pixel electrodes ELT may be stably separated by the third insulating layer, electrical stability between the first and second end portions EP1 and EP2 of the light emitting elements LD may be secured. Accordingly, a short defect may be effectively prevented from occurring between the first and second end portions EP1 and EP2 of the light emitting elements LD.

The pixel electrodes ELT may be electrically connected to at least one of the connection electrodes CNE through the contact holes CH passing through the first insulating layer INS1 disposed under the pixel electrodes ELT. For example, the first pixel electrode ELT1 may contact the first connection electrode CNE1 through the first contact hole CH1 passing through the first insulating layer INS1. The second pixel electrode ELT2 may contact the second connection electrode CNE2 through the second contact hole CH2 passing through the first insulating layer INS1. The pixel electrodes ELT may be electrically separated from the alignment electrodes ALE to electrically connect the light emitting elements LD and the connection electrodes CNE. For example, the light emitting elements LD and the connection electrodes CNE may be electrically separated from the alignment electrodes ALE. Accordingly, signal interference may be prevented in the process of aligning the light emitting elements LD, and the circuit layer PCL including the pixel circuit PXC or the display layer DPL including the alignment electrodes ALE may be repaired independently even though a defect occurs in the circuit layer PCL including the pixel circuit PXC or the display layer DPL including the alignment electrodes ALE. Therefore, reliability of the display panel PNL may be improved.

As described above, the pixel electrodes ELT and the connection electrodes CNE may be formed of a same material. For example, each of the pixel electrodes ELT may be configured of various transparent conductive materials. For example, the pixel electrodes ELT may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and/or fluorine tin oxide (FTO), and may be implemented to be substantially transparent or translucent to satisfy a transmittance. Accordingly, the light emitted from the first and second end portions EP1 and EP2 of the light emitting elements LD may pass through the pixel electrodes ELT and may be emitted to the outside of the display panel PNL. As described above, in case that the pixel electrodes ELT and the connection electrodes CNE are formed of a same material, since galvanic corrosion due to contact of the pixel electrodes ELT and the connection electrodes CNE may be minimized, an RC delay may be prevented to improve a luminance characteristic of the display panel PNL.

Hereinafter, another embodiment is described. In the following embodiment, substantially the same components previously described may be referred to by the same reference numeral, and a repetitive description may be omitted or simplified.

Figure 10:
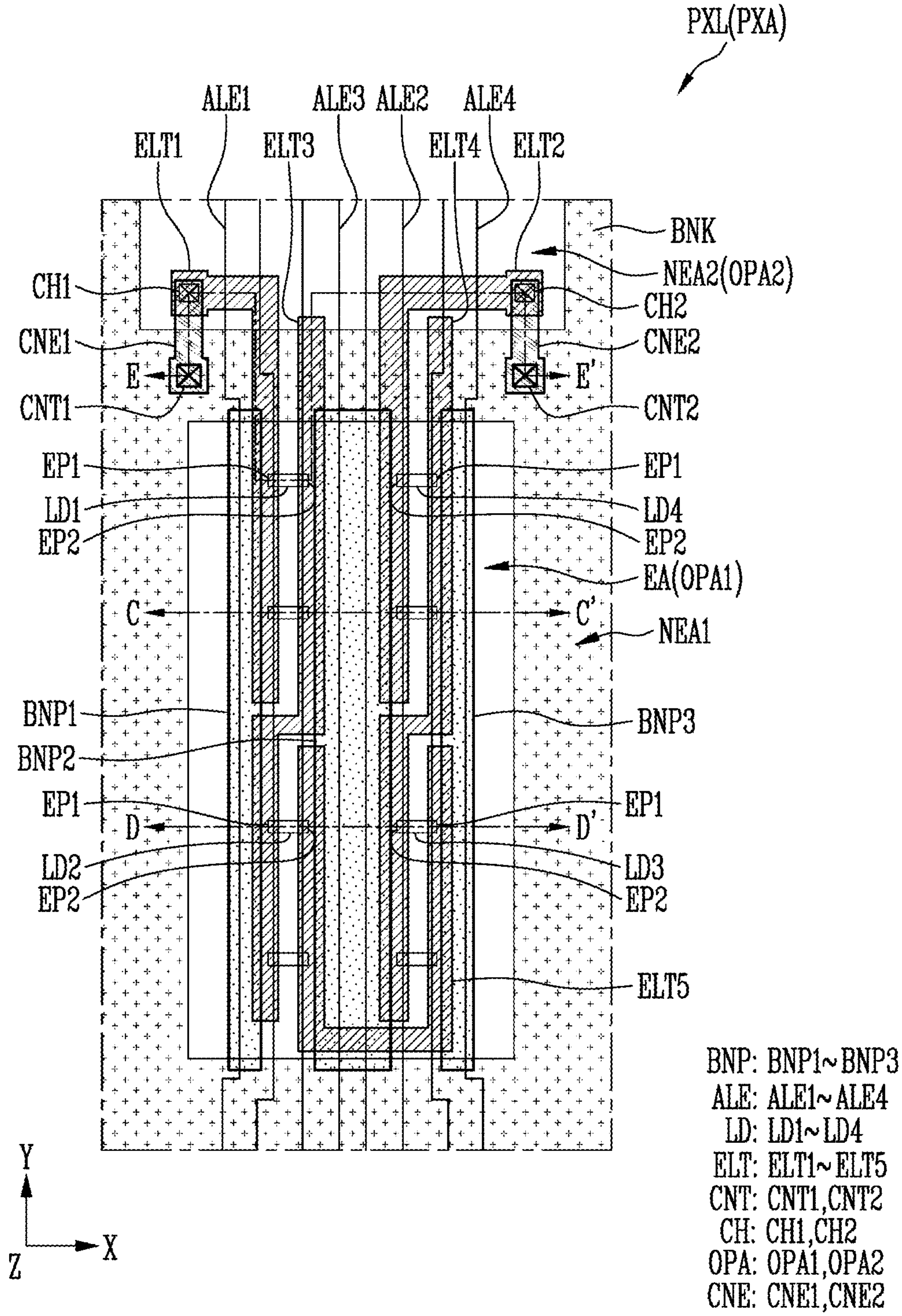
FIG. 10 is a schematic plan view illustrating a pixel according to another embodiment.
Figure 11:
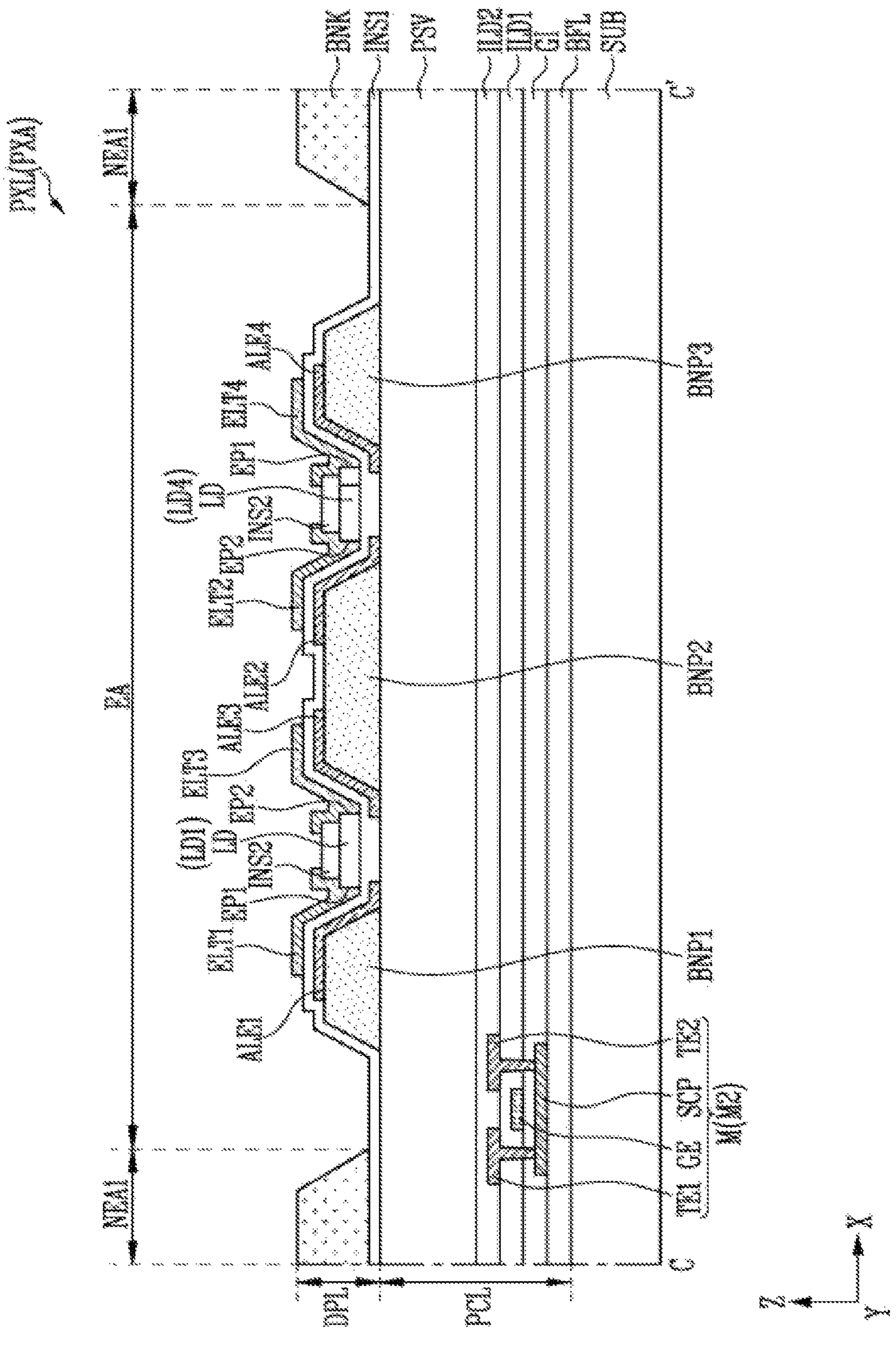
FIG. 11 is a schematic cross-sectional view taken along line C-C' of FIG. 10.
Figure 12:
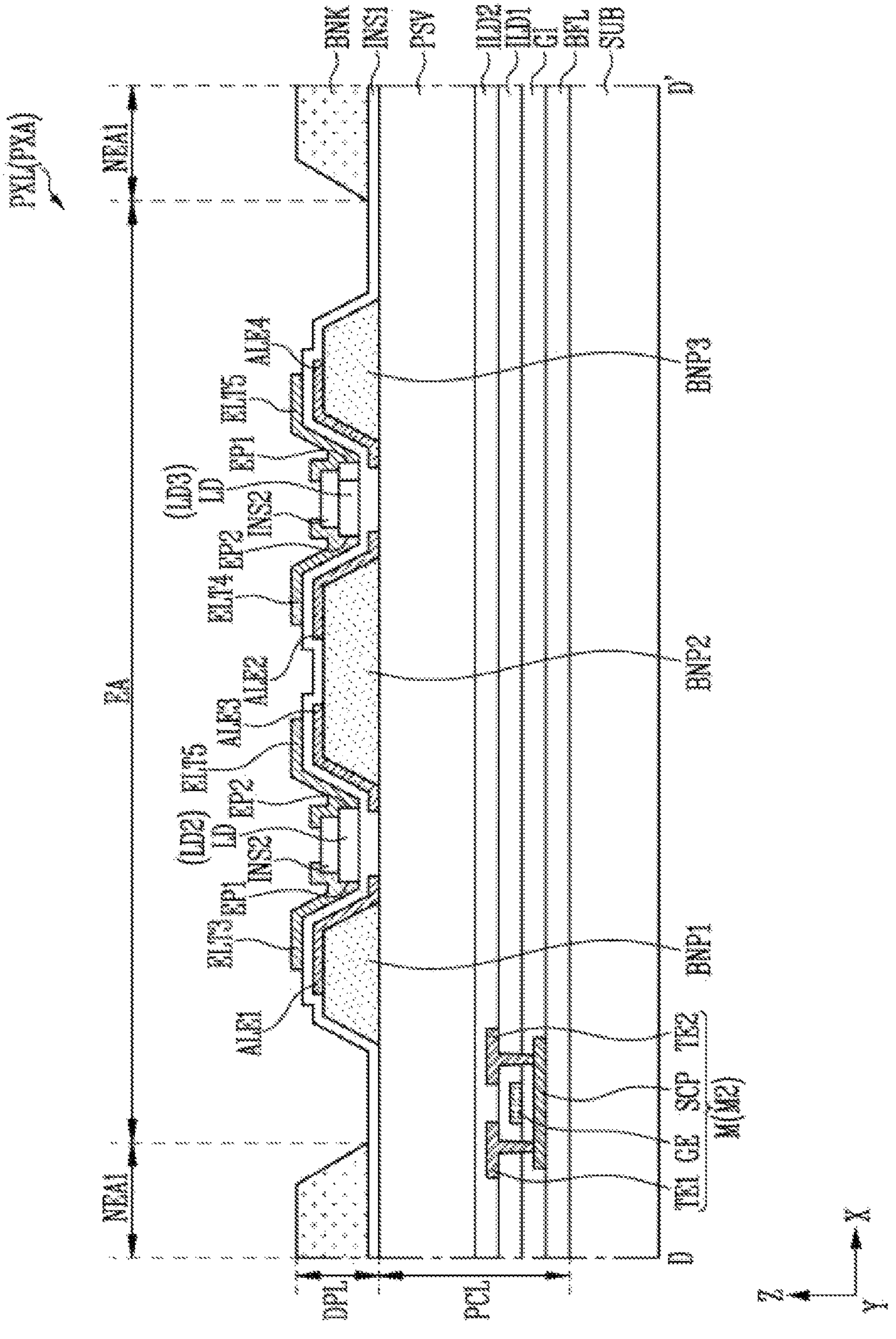
FIG. 12 is a schematic cross-sectional view taken along line D-D' of FIG. 10.
Figure 13:
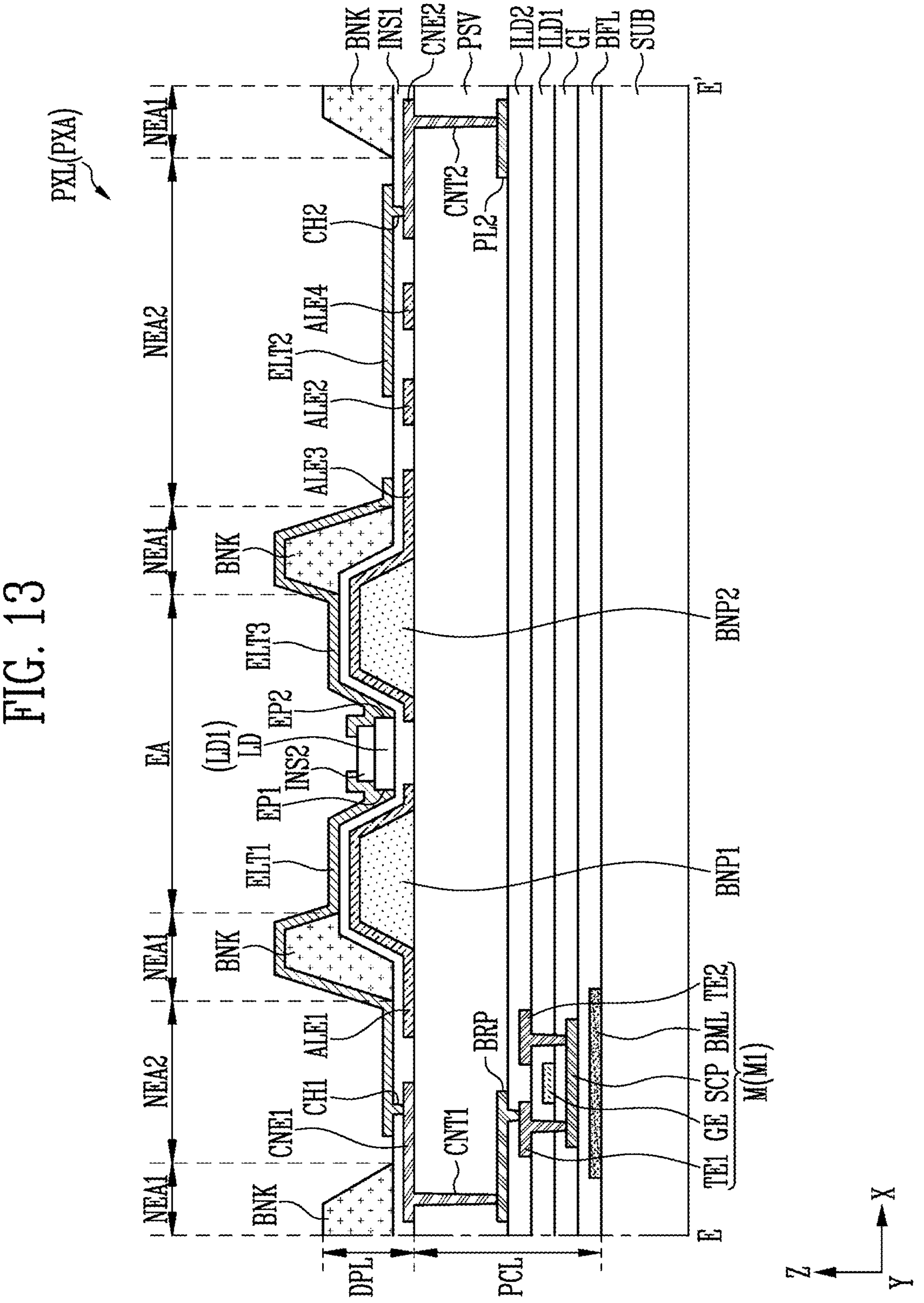
FIG. 13 is a schematic cross-sectional view taken along line E-E' of FIG. 10.

FIG. 10 is a schematic plan view illustrating a pixel according to another embodiment. FIG. 11 is a schematic cross-sectional view taken along line C-C' of FIG. 10. FIG. 12 is a schematic cross-sectional view taken along line D-D' of FIG. 10. FIG. 13 is a schematic cross-sectional view taken along line E-E' of FIG. 10.

Referring to FIGS. 10 to 13, a display device according to an embodiment may be distinguished from an embodiment of FIGS. 6 to 9 in that the pixel PXL includes the light emitting elements LD disposed at four series stages as shown in FIG. 5.

Hereinafter, when one or more of the first to fourth light emitting elements LD1 to LD4 are arbitrarily referred to, or when two or more types of light emitting elements are collectively referred to, the one or more of the first to fourth light emitting elements LD1 to LD4 or two or more types of light emitting elements are referred to as a "light emitting element LD" or "light emitting elements LD". When at least one of alignment electrodes including first to fourth alignment electrodes ALE1 to ALE4 are arbitrarily referred to, the at least one of alignment electrodes ALE1 to ALE4 may be referred to as an "alignment electrode ALE" or "alignment electrodes ALE", and when at least one of pixel electrodes including the first to fifth pixel electrodes ELT1 to ELT5 may be arbitrarily referred to, the at least one of pixel electrodes ELT1 to ELT5 may be referred to as a "pixel electrode ELT" or "pixel electrodes ELT".

Each pixel PXL may include the first to fifth pixel electrodes ELT1 to ELT5, the first to fourth light emitting elements LD1 to LD4 electrically connected between the first to fifth pixel electrodes ELT1 to ELT5 the first to fourth alignment electrodes ALE1 to ALE4, and the first and second connection electrodes CNE1 and CNE2 electrically connected to at least one of the first to fifth pixel electrodes ELT1 to ELT5.

The first light emitting element LD1 may be aligned between the first and second patterns BNP1 and BNP2. The first light emitting element LD1 may be electrically connected between the first and third pixel electrodes ELT1 and ELT3. For example, the first light emitting element LD1 may be aligned on a side (or an upper end) of a region between the first and second patterns BNP1 and BNP2, the first end portion EP1 of the first light emitting element LD1 may be electrically connected to the first pixel electrode ELT1, and the second end portion EP2 of the first light emitting element LD1 may be electrically connected to the third pixel electrode ELT3.

The second light emitting element LD2 may be aligned between the first and second patterns BNP1 and BNP2. The second light emitting element LD2 may be electrically connected between the third and fifth pixel electrodes ELT3 and ELT5. For example, the second light emitting element LD2 may be aligned on another side (or a lower end) of the region between the first and second patterns BNP1 and BNP2, the first end portion EP1 of the second light emitting element LD2 may be electrically connected to the third pixel electrode ELT3, and the second end portion EP2 of the second light emitting element LD2 may be electrically connected to the fifth pixel electrode ELT5.

The third light emitting element LD3 may be aligned between the second and third patterns BNP2 and BNP3. The third light emitting element LD3 may be electrically connected between the fourth and fifth pixel electrodes ELT4 and ELT5. For example, the third light emitting element LD3 may be aligned on another side (or a lower end) of a region between the second and third patterns BNP2 and BNP3, the first end portion EP1 of the third light emitting element LD3 may be electrically connected to the fifth pixel electrode ELT5, and the second end portion EP2 of the third light emitting element LD3 may be electrically connected to the fourth pixel electrode ELT4.

The fourth light emitting element LD4 may be aligned between the second and third patterns BNP2 and BNP3. The fourth light emitting element LD4 may be electrically connected between the second and fourth pixel electrodes ELT2 and ELT4. For example, the fourth light emitting element LD4 may be aligned on a side (or an upper end) of the region between the second and third patterns BNP2 and BNP3, the first end portion EP1 of the fourth light emitting element LD4 may be electrically connected to the fourth pixel electrode ELT4, and the second end portion EP2 of the fourth light emitting element LD4 may be electrically connected to the second pixel electrode ELT2.

For example, the first light emitting element LD1 may be positioned in an upper left area of the emission area EA, and the second light emitting element LD2 may be positioned in a lower left area of the emission area EA. The third light emitting element LD3 may be positioned in a lower right area of the emission area EA, and the fourth light emitting element LD4 may be positioned in an upper right area of the emission area EA. However, an arrangement, a connection structure, and/or the like of the light emitting elements LD may be variously changed according to a structure of the light emitting unit EMU, the number of series stages, and/or the like.

The first pixel electrode ELT1 may be disposed on the first end portions EP1 of the first light emitting elements LD1 and may be electrically connected to the first end portions EP1 of the first light emitting elements LD1.

The second pixel electrode ELT2 may be disposed on the second end portions EP2 of the fourth light emitting elements LD4 and may be electrically connected to the second end portions EP2 of the fourth light emitting elements LD4. The second pixel electrode ELT2 may be electrically connected to the first, second, and third light emitting elements LD1, LD2, and LD3 via at least another pixel electrode ELT and/or the light emitting element LD. For example, the second pixel electrode ELT2 may be electrically connected to the second end portions EP2 of the first light emitting elements LD1 via the third pixel electrode ELT3, the second light emitting element LD2, the fifth pixel electrode ELT5, the third light emitting element LD3, the fourth pixel electrode ELT4, and the fourth light emitting element LD4.

The third pixel electrode ELT3 may be disposed on the second end portions EP2 of the first light emitting elements LD1 and may be electrically connected to the second end portions EP2 of the first light emitting elements LD1. The third pixel electrode ELT3 may be disposed on the first end portions EP1 of the second light emitting elements LD2 and may be electrically connected to the first end portions EP1 of the second light emitting elements LD2. For example, the third pixel electrode ELT3 may electrically connect the second end portions EP2 of the first light emitting elements LD1 and the first end portions EP1 of the second light emitting elements LD2 in the emission area EA. To this end, the third pixel electrode ELT3 may have a curved shape. For example, the third pixel electrode ELT3 may have a curved or bent structure at a boundary between a region in which at least one first light emitting element LD1 may be arranged and a region in which at least one second light emitting element LD2 may be arranged.

The third pixel electrode ELT3 may be positioned between the first and second pixel electrodes ELT1 and ELT2, and may be electrically connected between the first and second pixel electrodes ELT1 and ELT2 through the light emitting elements LD. For example, the third pixel electrode ELT3 may be connected to the first pixel electrode ELT1 through at least one first light emitting element LD1, and may be connected to the second pixel electrode ELT2 through at least one second, third, and/or fourth light emitting element LD2, LD3, and/or LD4.

The fourth pixel electrode ELT4 may be disposed on the second end portions EP2 of the third light emitting elements LD3 and may be electrically connected to the second end portions EP2 of the third light emitting elements LD3. The fourth pixel electrode ELT4 may be disposed on the first end portions EP1 of the fourth light emitting elements LD4 and may be electrically connected to the first end portions EP1 of the fourth light emitting elements LD4. For example, the fourth pixel electrode ELT4 may electrically connect the second end portions EP2 of the third light emitting elements LD3 and the first end portions EP1 of the fourth light emitting elements LD4 in the emission area EA. To this end, the fourth pixel electrode ELT4 may have a curved shape. For example, the fourth pixel electrode ELT4 may have a curved or bent structure at a boundary between a region in which at least one third light emitting element LD3 may be arranged and a region in which at least one fourth light emitting element LD4 may be arranged.

The fourth pixel electrode ELT4 may be electrically connected between the first and second pixel electrodes ELT1 and ELT2 through the light emitting elements LD. For example, the fourth pixel electrode ELT4 may be connected to the first pixel electrode ELT1 through at least one of the first, second, and/or third light emitting elements LD1, LD2, and/or LD3 and may be connected to the second pixel electrode ELT2 through at least fourth light emitting element LD4.

The fifth pixel electrode ELT5 may be disposed on the second end portions EP2 of the second light emitting elements LD2 and may be electrically connected to the second end portions EP2 of the second light emitting elements LD2. The fifth pixel electrode ELT5 may be disposed on the first end portions EP1 of the third light emitting elements LD3 and may be electrically connected to the first end portions EP1 of the third light emitting elements LD3. For example, the fifth pixel electrode ELT5 may electrically connect the second end portions EP2 of the second light emitting elements LD2 and the first end portions EP1 of the third light emitting elements LD3 in the emission area EA. To this end, the fifth pixel electrode ELT5 may have a curved shape. For example, the fifth pixel electrode ELT5 may have a curved or bent structure at a boundary between a region in which at least one second light emitting element LD2 may be arranged and a region in which at least one third light emitting element LD3 may be arranged, or around the boundary. In an embodiment, the fifth pixel electrode ELT5 may not extend to the second non-emission area NEA2 and may be formed only inside the emission area EA, but is not limited thereto.

The fifth pixel electrode ELT5 may be electrically connected between the first and second pixel electrodes ELT1 and ELT2 through the light emitting elements LD. For example, the fifth pixel electrode ELT5 may be electrically connected to the first pixel electrode ELT1 through at least one first and/or second light emitting elements LD1 and/or LD2, and may be electrically connected to the second pixel electrode ELT2 through at least one third and/or fourth light emitting elements LD3 and LD4.

In an embodiment, each of the pixel electrodes ELT may extend from the emission area EA to the second non-emission area NEA2 through the first non-emission area NEA1, and may be electrically connected to at least one connection electrode CNE through the contact hole CH in the second non-emission area NEA2. For example, the first pixel electrode ELT1 may be electrically connected to the first connection electrode CNE1 through the first contact hole CH1 positioned in the second non-emission area NEA2, and the second pixel electrode ELT2 may be electrically connected to the second connection electrode CNE2 through the second contact hole CH2 positioned in the second non-emission area NEA2. As described above, in case that the contact holes CH are disposed in the second non-emission area NEA2, since the contact holes CH may be formed by avoiding the emission area EA to which the light emitting elements LD may be supplied and aligned, in the step of aligning the light emitting elements LD, a more uniform electric field may be formed in the emission area EA, and separation of the light emitting elements LD may be prevented.

The first connection electrode CNE1 may be connected to the pixel circuit PXC and/or the first power line PL1 through the first contact portion CNT1, and the second connection electrode CNE2 may be connected to the second power line PL2 through the second contact portion CNT2. Accordingly, the pixel electrodes ELT may be connected to the pixel circuit PXC and/or the power line through the connection electrodes CNE. For example, the first pixel electrode ELT1 may be electrically connected to the pixel circuit PXC and/or the first power line PL1 through the first connection electrode CNE1, and the second pixel electrode ELT2 may be electrically connected to the second power line PL2 through the second connection electrode CNE2. The connection electrodes CNE and/or the pixel electrodes ELT may be electrically separated from the alignment electrodes ALE. For example, the pixel electrodes ELT may be electrically separated from the alignment electrodes ALE, and may be connected to the pixel circuit PXC and/or the power line through the connection electrodes CNE. Accordingly, the circuit layer PCL including the pixel circuit PXC or the display layer DPL including the alignment electrodes ALE may be repaired independently even though a defect occurs in the circuit layer PCL including the pixel circuit PXC or the display layer DPL including the alignment electrodes ALE as described above.

The pixel electrodes ELT may be disposed on the first and second end portions EP1 and EP2 of the light emitting elements LD. The pixel electrodes ELT may be disposed (e.g., directly disposed) on the first and second end portions EP1 and EP2 of the light emitting elements LD and may be in contact with the first and second end portions EP1 and EP2 of the light emitting elements LD.

The pixel electrodes ELT may be disposed on a same layer. For example, as shown in FIGS. 11 and 12, the pixel electrodes ELT may be formed of a same conductive layer.

The pixel electrodes ELT may be formed simultaneously in a same process, but the disclosure is not limited thereto. For example, as described with reference to FIG. 8, the pixel electrodes ELT may be configured of multiple conductive layers and may be disposed on different layers.

The pixel electrodes ELT may be electrically connected to at least one of the connection electrodes CNE through the contact holes CH passing through the first insulating layer INS1 disposed under the pixel electrodes ELT. For example, the first pixel electrode ELT1 may contact the first connection electrode CNE1 through the first contact hole CH1 passing through the first insulating layer INS1. The second pixel electrode ELT2 may contact the second connection electrode CNE2 through the second contact hole CH2 passing through the first insulating layer INS1. The pixel electrodes ELT may be electrically separated from the alignment electrodes ALE to electrically connect the light emitting elements LD and the connection electrodes CNE. For example, the light emitting elements LD and the connection electrodes CNE may be electrically separated from the alignment electrodes ALE.

The pixel electrodes ELT and the connection electrodes CNE may be formed of a same material. For example, each of the pixel electrodes ELT may be configured of various transparent conductive materials. For example, the pixel electrodes ELT may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and/or fluorine tin oxide (FTO), and may be implemented to be substantially transparent or translucent to satisfy a transmittance. Accordingly, the light emitted from the first and second end portions EP1 and EP2 of the light emitting elements LD may pass through the pixel electrodes ELT and may be emitted to the outside of the display panel PNL. As described above, in case that the pixel electrodes ELT and the connection electrodes CNE are formed of a same material, since galvanic corrosion due to contact of the pixel electrodes ELT and the connection electrodes CNE may be minimized, an RC delay may be prevented, as described above.

Since the alignment electrodes ALE, the light emitting elements LD, the pixel electrodes ELT, and the connection electrodes CNE are described in detail with reference to FIGS. 1 to 9, a repetitive description is omitted.

Those skilled in the art will understand that the disclosure may be implemented in a modified form without departing from the above-described characteristics. Therefore, the disclosed embodiments should be considered as descriptive and not limiting. The scope of the disclosure should be determined by the claims including equivalents thereof.

What is claimed is:

1. A display device comprising:

a substrate;

a transistor on and over the substrate and disposed in a pixel;

a connection electrode electrically connected to the transistor;

first electrodes electrically separated from the connection electrode and disposed on and over the transistor;

light emitting elements disposed between the first electrodes;

second electrodes disposed on the first electrodes and the light emitting elements; and a bridge electrode on the transistor and electrically separated from the first electrodes, wherein at least one of the second electrodes electrically connect the connection electrode and one of the light emitting elements to each other, wherein the first electrodes are electrically separated from the light emitting elements, wherein the connection electrode is electrically connected to the transistor through the bridge electrode, wherein the light emitting elements do not overlap the bridge electrode in a plan view, and wherein, in a plan view, the at least one of the second electrodes overlaps with an end of the bridge electrode and an end of one of the first electrodes that are spaced apart from each other.

2. The display device according to claim 1, wherein the connection electrode is disposed between the transistor and the at least one of the second electrodes in a cross sectional view.

3. The display device according to claim 2, wherein the second electrodes are electrically separated from the first electrodes, and at least one pair of the second electrodes and the first electrodes overlap each other and receive different signals.

4. The display device according to claim 3, further comprising:

an insulating layer disposed on the first electrodes, wherein the at least one of the second electrodes is electrically connected to the connection electrode through a contact hole passing through the insulating layer.

5. The display device according to claim 4, wherein the at least one of the second electrodes is electrically connected to the transistor through the connection electrode.

6. The display device according to claim 5, wherein the at least one of the second electrodes is in electrical contact with the connection electrode.

7. The display device according to claim 6, wherein the connection electrode and the at least one of the second electrodes are formed of a same material.

8. The display device according to claim 7, wherein the connection electrode does not overlap the first electrodes in a plan view.

9. The display device according to claim 8, further comprising:

an emission area;

a first non-emission area surrounding the emission area; and a second non-emission area adjacent to the first non-emission area and spaced apart from the emission area.

10. The display device according to claim 9, further comprising:

a bank disposed in the first non-emission area.

11. The display device according to claim 10, wherein the bank includes:

a first opening overlapping the emission area; and a second opening overlapping the second non-emission area.

12. The display device according to claim 11, wherein the connection electrode is disposed in at least one of the first non-emission area or the second non-emission area.

13. The display device according to claim 12, wherein the connection electrode at least partially overlaps the bank.

14. The display device according to claim 13, wherein the connection electrode is electrically connected to the transistor through a first contact hole disposed in the first non-emission area.

15. The display device according to claim 14, wherein the second electrode is electrically connected to the connection electrode through a second contact hole disposed in the second non-emission area.

16. The display device according to claim 15, wherein the at least one of the second electrodes extends from the emission area to the second non-emission area through the first non-emission area.

17. The display device according to claim 16, wherein the transistor includes at least one of a source electrode or a drain electrode, and the connection electrode is electrically connected to the source electrode or the drain electrode.

18. The display device according to claim 1, further comprising:

an insulating layer disposed on the bridge electrode, wherein the connection electrode is in electrical contact with the bridge electrode through a contact hole passing through the insulating layer.

19. The display device according to claim 1, further comprising:

a protection layer on and over the transistor, the protection layer also disposed below the first electrodes.

* * * * *